US012559644B2

(12) United States Patent
Baskaran et al.

(10) Patent No.: US 12,559,644 B2
(45) Date of Patent: Feb. 24, 2026

(54) RAPID CROSS-LINKABLE NEUTRAL UNDERLAYERS FOR CONTACT HOLE SELF-ASSEMBLY OF POLYSTYRENE-B-POLY(METHYL METHACRYLATE) DIBLOCK COPOLYMERS AND THEIR FORMULATION THEREOF

(71) Applicant: Merck Patent GmbH, Darmstadt (DE)

(72) Inventors: Durairaj Baskaran, Bridgewater, NJ (US); Md S. Rahman, Flemington, NJ (US); Victor Monreal, Breinigsville, PA (US)

(73) Assignee: Merck Patent GmbH, Darmstadt (DE)

( * ) Notice: Subject to any disclaimer, the term of this patent is extended or adjusted under 35 U.S.C. 154(b) by 868 days.

(21) Appl. No.: 17/293,710

(22) PCT Filed: Dec. 4, 2019

(86) PCT No.: PCT/EP2019/083589
§ 371 (c)(1),
(2) Date: May 13, 2021

(87) PCT Pub. No.: WO2020/115090
PCT Pub. Date: Jun. 11, 2020

(65) Prior Publication Data

US 2022/0002575 A1 Jan. 6, 2022

Related U.S. Application Data

(60) Provisional application No. 62/776,802, filed on Dec. 7, 2018.

(51) Int. Cl.
*C08F 212/08* (2006.01)
*C08F 212/32* (2006.01)

(Continued)

(52) U.S. Cl.
CPC ........ *C09D 133/068* (2013.01); *C08F 212/08* (2013.01); *C08F 220/14* (2013.01);
(Continued)

(58) Field of Classification Search
CPC .. C08F 220/14; C08F 220/325; C08F 212/08; C08F 212/32; C09D 133/12; C09D 133/068
See application file for complete search history.

(56) References Cited

U.S. PATENT DOCUMENTS 3,161,630 A 12/1964 Auguste et al.
3,285,949 A 11/1966 Siebert (Continued)

FOREIGN PATENT DOCUMENTS

CA 1293090 C 12/1991
EP 0227124 A2 7/1987

(Continued)

OTHER PUBLICATIONS

"A Generalized . . . Solid Surfaces"; Ryu et al; Science; vol. 308; pp. 236-238 (Year: 2005).*

(Continued)

*Primary Examiner* — Karuna P Reddy
(74) *Attorney, Agent, or Firm* — EMD Performance Materials Corp.

(57) ABSTRACT

The present invention relates to a random copolymer comprising repeat units of structure (I), (II), (III), and (IV). The invention also pertains to a neutral layer composition comprised of said random copolymer and also pertains to the use of said neutral layer composition to make a crosslinked neutral layer film on a substrate, which can enable self-assembly of a film of a block copolymer overlying said crosslinked neutral layer, wherein said block copolymer contains etch resistant and etchable block, and whose self-assembled pattern is used, through etching, to create either an array of contact holes or posts in said substrate.

(I)

(II)

(Continued)

-continued

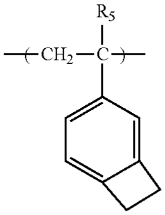

(III)

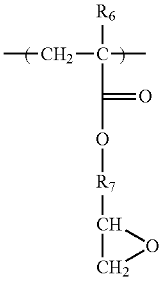

(IV)

20 Claims, 7 Drawing Sheets

Figure 1:
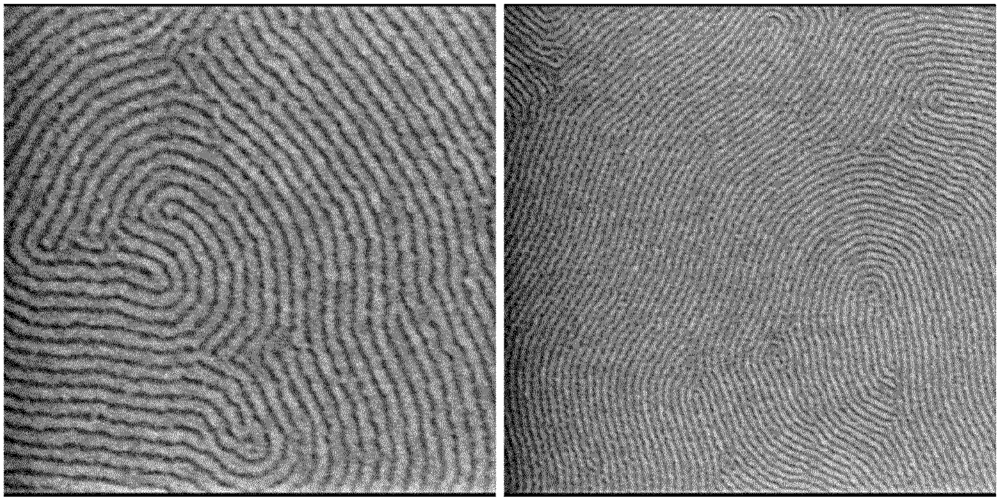
Figure 1:
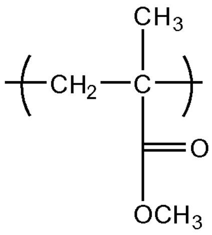
Figure 1:
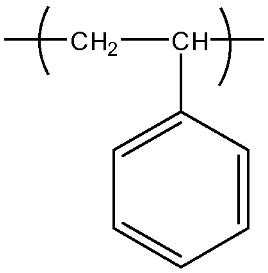
Figure 1:
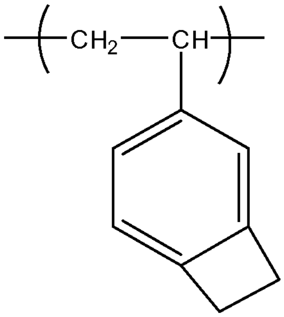

(51) Int. Cl.

| | |
|---|---|
| ***C08F 220/14*** | (2006.01) |
| ***C09D 5/00*** | (2006.01) |
| ***C09D 125/06*** | (2006.01) |
| ***C09D 133/06*** | (2006.01) |
| ***C09D 133/12*** | (2006.01) |
| ***C09D 153/00*** | (2006.01) |
| ***H01L 21/027*** | (2006.01) |

(52) U.S. Cl.

CPC ............ *C09D 5/002* (2013.01); *C09D 5/008* (2013.01); *C09D 125/06* (2013.01); *C09D 153/00* (2013.01); *H01L 21/0271* (2013.01); *C08F 2438/00* (2013.01); *C08F 2800/10* (2013.01)

(56) References Cited

U.S. PATENT DOCUMENTS

| | | | |
|---|---|---|---|
| 3,285,959 | A | 11/1966 | Mcfarlane |
| 3,474,054 | A | 10/1969 | White |
| 3,919,077 | A | 11/1975 | Whitehurst |
| 4,200,729 | A | 4/1980 | Calbo |
| 4,251,665 | A | 2/1981 | Calbo |
| 4,698,394 | A | 10/1987 | Wong |
| 5,136,029 | A | 8/1992 | Furukawa et al. |
| 5,187,019 | A | 2/1993 | Calbo et al. |
| 5,446,125 | A | 8/1995 | Honda et al. |
| 5,674,662 | A | 10/1997 | Szmanda et al. |
| 5,929,204 | A | 7/1999 | Noguchi et al. |
| 6,512,020 | B1 | 1/2003 | Asakura et al. |
| 7,471,614 | B2 | 12/2008 | Frommer et al. |
| 7,521,094 | B1 | 4/2009 | Cheng et al. |
| 7,560,141 | B1 | 7/2009 | Kim et al. |
| 7,846,502 | B2 | 12/2010 | Kim et al. |
| 8,017,194 | B2 | 9/2011 | Colburn et al. |
| 8,226,838 | B2 | 7/2012 | Cheng et al. |
| 8,309,278 | B2 | 11/2012 | Yang et al. |
| 8,491,965 | B2 | 7/2013 | Cheng et al. |
| 8,686,109 | B2 | 4/2014 | Yin et al. |
| 8,691,925 | B2 | 4/2014 | Wu et al. |
| 8,795,539 | B2 | 8/2014 | Lee et al. |
| 8,835,581 | B2 | 9/2014 | Wu et al. |
| 9,052,598 | B2 | 6/2015 | Wu et al. |
| 9,109,086 | B2 | 8/2015 | Tang |
| 9,574,104 | B1 * | 2/2017 | Kim .................. H01L 21/0273 |
| 2004/0068071 | A1 | 4/2004 | Hoff et al. |
| 2004/0151690 | A1 | 8/2004 | Nakanishi et al. |
| 2004/0157948 | A1 | 8/2004 | Schlueter |
| 2005/0062861 | A1 | 3/2005 | Hamasaki |
| 2007/0276104 | A1 | 11/2007 | Harruna et al. |
| 2008/0299353 | A1 | 12/2008 | Stoykovich et al. |
| 2008/0318005 | A1 | 12/2008 | Millward |
| 2009/0035668 | A1 | 2/2009 | Breyta et al. |
| 2009/0075002 | A1 | 3/2009 | Kim et al. |
| 2009/0087653 | A1 | 4/2009 | Nealey et al. |
| 2009/0179002 | A1 | 7/2009 | Cheng et al. |
| 2009/0196488 | A1 | 8/2009 | Nealey et al. |
| 2009/0286927 | A1 | 11/2009 | Sodergard et al. |
| 2010/0124629 | A1 * | 5/2010 | Gopalan .............. C09D 125/14 427/510 |
| 2010/0316849 | A1 | 12/2010 | Millward et al. |
| 2011/0147984 | A1 | 6/2011 | Cheng et al. |
| 2012/0273460 | A1 | 11/2012 | Kang et al. |
| 2012/0285929 | A1 | 11/2012 | Matsumura et al. |
| 2013/0012618 | A1 | 1/2013 | Hiro et al. |
| 2013/0059130 | A1 | 3/2013 | Gopalan et al. |
| 2013/0078576 | A1 | 3/2013 | Wu et al. |
| 2013/0280497 | A1 | 10/2013 | Wilson et al. |
| 2013/0330668 | A1 | 12/2013 | Wu et al. |
| 2014/0151330 | A1 | 6/2014 | Yin et al. |
| 2014/0193754 | A1 | 7/2014 | Wu et al. |
| 2014/0299969 | A1 | 10/2014 | Xu et al. |
| 2014/0335324 | A1 | 11/2014 | Kim et al. |
| 2014/0342290 | A1 | 11/2014 | Wu et al. |
| 2015/0093912 | A1 | 4/2015 | Wu et al. |
| 2015/0184017 | A1 | 7/2015 | Hustad et al. |
| 2015/0197594 | A1 | 7/2015 | Xu et al. |

FOREIGN PATENT DOCUMENTS

| | | | |
|---|---|---|---|
| EP | 1095711 | A2 | 5/2001 |
| EP | 3296335 | A1 | 3/2018 |
| GB | 715913 | A | 9/1954 |
| JP | 58-225103 | A | 12/1983 |
| JP | 2003-48929 | A | 2/2003 |
| JP | 2003-238682 | A | 8/2003 |
| JP | 2004-255299 | A | 9/2004 |
| JP | 2008-88368 | A | 4/2008 |
| JP | 2010-260883 | A | 11/2010 |
| JP | 2011-18778 | A | 1/2011 |
| JP | 2013-8951 | A | 1/2013 |
| JP | 2014-528015 | A | 10/2014 |
| JP | 2018-519379 | A | 7/2018 |
| JP | 2018-538382 | A | 12/2018 |
| KR | 10-2008-0109294 | A | 12/2008 |
| WO | 2008/097736 | A2 | 8/2008 |
| WO | 2011/080016 | A2 | 7/2011 |
| WO | 2012/022390 | A1 | 2/2012 |
| WO | 2012/161106 | A1 | 11/2012 |
| WO | 2013/041958 | A1 | 3/2013 |
| WO | 2013/050338 | A1 | 4/2013 |
| WO | 2013/119832 | A1 | 8/2013 |
| WO | 2013/156240 | A1 | 10/2013 |
| WO | 2013/160027 | A1 | 10/2013 |
| WO | 2014/165530 | A1 | 10/2014 |
| WO | 2015/109224 | A1 | 7/2015 |
| WO | 2017/064199 | A1 | 4/2017 |
| WO | 2020/115090 | A1 | 6/2020 |

OTHER PUBLICATIONS

International Search Report and Written Opinion for International Application No. PCT/EP2013/001423, dated Aug. 28, 2013, 8 pages.

International Search Report and Written Opinion for International Application No. PCT/EP2013/053548, dated Jul. 11, 2013, 9 pages.

International Search Report and Written Opinion for International Application No. PCT/EP2014/059568, mailed on Aug. 6, 2014, 10 pages.

(56) References Cited

OTHER PUBLICATIONS

International Search Report and Written Opinion for International Application No. PCT/EP2014/070391, mailed on Jan. 14, 2015, 7 pages.
International Search Report and Written Opinion for International Application No. PCT/EP2014/076849, dated Feb. 10, 2015, 12 pages.
International Search Report and Written Opinion for International Application No. PCT/IB2012/001905, dated Feb. 26, 2013, 11 pages.
International Search Report and Written Opinion for International Application No. PCT/EP2019/083589, dated Mar. 17, 2020, 8 pages.
Asakawa et al., "Nanopatterning with Microdomains of Block Copolymers using Reactive-Ion Etching Selectivity", Japanese Journal of Applied Physics, vol. 41, No. 10, Part 1, 2002, pp. 6112-6118.
Bang et al., "Facile Routes to Patterned Surface Neutralization Layers for Block Copolymer Lithography", Advanced Materials, vol. 19, Issue 24, 2007, pp. 4552-4557.
Bates et al., "Single-and Dual-Component Cross-Linked Polymeric Surface Treatments for Controlling Block Copolymer Orientation", Polymer Preprints vol. 52(1), 2011, pp. 181-182.
Black et al., "Integration of self-assembled diblock copolymers for semiconductor capacitor fabrication", Applied Physics Letters, vol. 79, No. 3, 2001, pp. 409-411.
Burch et al., "Scrambling of Fluoro-, Methoxyl, Dimethylamino-, and Methyl Groups with Chlorine Atoms and of Methoxyl with Dimethylamino-Groups on Germanium", Journal of the Chemical Society, 1966, pp. 586-589.
Caster et al., "Applications of Polymer Brushes and Other Surface-Attached Polymers", Polymer Brushes Part 17, 2004, pp. 331-370.
Cheng et al., "Templated Self-Assembly of Block Copolymers: Effect of Substrate Topography", Advanced Materials, vol. 15 No. 19, 2003, pp. 1599-1602.
David et al., "Synthesis of α,ω-Phosphonate Polystyrene via Dead End Polymerization", Phosphorus, Sulfur, and Silicon and the Related Elements, vol. 179, No. 12, 2004, pp. 2627-2634.
Drockenmuller et al., "Covalent stabilization of nanostructures: Robust block copolymer templates from novel thermoreactive systems", Journal of Polymer Science, Part A: Polymer Chemistry, vol. 43, Issue 5, 2005, pp. 1028-1037.
Dunlop Iaine. , "Interactions Between Polymer Brushes: Varying the Number of End-Attaching Groups", Macromol. Chem. Phys. vol. 205, 2004, pp. 2443-2450.
Endo et al., "Synthesis of poly(4-vinylbenzocyclobutene) and its reaction with dienophiles", Journal of Polymer Science Part A: Polymer Chemistry, vol. 33, No. 4, Mar. 1995, pp. 707-715.
Han et al., "Photopatternable Imaging Layers for Controlling Block Copolymer Microdomain Orientation", Advanced Materials vol. 19, 2007, pp. 4448-4452.
Harth et al., "A Facile Approach to Architecturally Defined Nanoparticles via Intramolecular Chain Collapse", Journal of the American Chemical Society, vol. 124, No. 29, 2002, pp. 8653-8660.
Hawker et al., "Facile Synthesis of Block Copolymers for Nanolithographic Applications", Polymer Preprints, American Chemical Society, vol. 46, No. 2, 2005, pp. 239-240.
Hawker CraigJ. , "Initiating Systems for Nitroxide-Mediated "Living" Free Radical Polymerizations: Synthesis and Evaluation", Macromolecules vol. 29 No. 16, Jul. 29, 1996, pp. 5245-5254.
Hieno et al., "Quick Formation of DSA Neutralization Polymer Layer Attached by Reactive Self-Assembled Monolayer", J. Photopol. Sci. Tech. vol. 25 No. 1, 2012, pp. 73-76.
Huang et al., "Using Surface Active Random Copolymers to Control the Domain Orientation in Diblock Copolymer Thin Films", Macromolecules, vol. 31 No. 22, 1998, pp. 7641-7650.
Jarnagin et al., "PS-b-PHost as a High x Block Copolymers for Directed Self Assembly: Optimnization of Underlayer and Solvent Anneal Processes", SPIE vol. 8680, 2013, pp. 86801X-1-pp. 86801X-1.
Ji et al., "Preparation of Neutral Wetting Brushes for Block Copolymer Films from Homopolymer Blends", Advanced materials, vol. 20 issue 16, Aug. 2008, pp. 3054-3060.
Kellogg et al., "Observed Surface Energy Effects in Confined Diblock Copolymers", The American Physical Society, vol. 76, No. 14, 1996, pp. 2503-2506.
Kim et al., "Dewetting of PMMA on PS-Brush Substrates", Macromolecules vol. 42 No. 20, 2009, pp. 7919-7923.
Kim et al., "Effect of Architecture on the Self-Assembly of Block Copolymers at Interfaces: Linear-nanoparticle vs. Linear AB Diblocks", Polymeric Materials: Science & Engineering Vo. 92, 2005, pp. 399-400.
Kim et al., "Importance of End-Group Structure in Controlling the Interfacial Activity of Polymer-Coated Nanoparticles", Macromolecules vol. 40 No. 6, 2007, pp. 1796-1798.
Kim et al., "The Dramatic Effect of Architecture on the Self-Assembly of Block Copolymers at Interfaces", Langmuir, vol. 21 No. 23, 2005, pp. 10444-10458.
Kim et al., "The Synthesis of Randum Brush for Nanostructure of Block Copolymer", Macromol. Symp, vol. 249-250, 2007, pp. 303-306.
Lazzari et al., "Methods for the Alignment and the Large-scale Ordering of Block Copolymer Morphologies", Block Copolymers in Nanoscience, Copyright Wiley-VCH Verlag GmbH & Co. KGaA, 2006, pp. 191-231.
Leiston-Belanger et al., "A Thermal and Manufacturable Approach to Stabilized Diblock Copolymer Templates", Macromolecules, vol. 38, No. 18, 2005, pp. 7676-7683.
Lin et al., "Photocrosslinking of Polymers Containing Cationically Polymerizable Groups in the Side-Chain by Sulfonium Salts", Journal of Polymer Science Part A: Polymer Chemistry vol. 30 Issue 5, 1992, pp. 933-936.
Listigovers et al., "Narrow Polydispersity Diblock and Triblock Copolymers of Alkyl Acrylates by a "Living" Stable Free Radical Polymerization", Macromolecules vol. 29 No. 27, 1996, pp. 8992-8993.
Liu et al., "Random Poly(methyl methacrylate-co-styrene) Brushes by ATRP to Create Neutral Surfaces for Block Copolymer Self-Assembly", Macromolecular Chemistry Physics vol. 213, No. 1, Jan. 16, 2012, pp. 108-115.
Mansky et al., "Controlling Polymer-Surface Interactions with Random Copolymer Brushes", Science, vol. 275, Issue 5305, Mar. 7, 1997, pp. 1458-1460.
Merlitz Holger, "Surface Instabilities of Monodisperse and Densely Grafter Polymer Brushes", Macromolecules vol. 41 No. 13, 2008, pp. 5070-5072.
Murata Hironobu, "Synthesis of Functionalized Polymer Monolayers from Active Ester Brushes", Macromolecules vol. 40 No. 15, 2007, pp. 5497-5503.
Patten et al., "Atom Transfer Radical Polymerization and the Synthesis of Polymeric Materials", Adv. Mater. vol. 10 Issue 12, 1998, pp. 901-915.
Quirk et al., "Thermoplastic Elastomers 2nd Edition", Hanser/Gardner Publications, 1996, pp. 74-78.
Ruiz et al., "Density Multiplication and Improved Lithography by Directed Block Copolymer Assembly", Science, vol. 321, 2008, pp. 936-939.
Ryu et al., "A Generalized Approach to the Modification of Solid Surfaces", Science, vol. 308, Issue 5719, Apr. 8, 2005, pp. 236-239.
Ryu et al., "Cylindrical Microdomain Orientation of PS-b-PMMA on the Balanced Interfacial Interactions: Composition Effect of Block Copolymers", Macromolecules vol. 42 No. 13, 2009, pp. 4902-4906.
Ryu et al., "Surface Modification with Cross-Linked Random Copolymers: Minimum Effective Thickness", Macromolecules vol. 40 No. 12, 2007, pp. 4296-4300.
Serhatli I. E, "Synthesis of hybrid liquid crystalline block copolymers by combination of cationic or promoted cationic and free-radical polymerizations", Polymer Bulletin vol. 34, 1995, pp. 539-546.

(56) References Cited

OTHER PUBLICATIONS

Sheriff et al., "Physical Characterization and Platelet Interactions under Shear Flows of a Novel Thermoset Polyisobutylene-based Co-polymer", ACS Applied Materials & Interfaces, vol. 7, No. 39, 2015, pp. 22058-22066.
Sugiyama et al., "Preparation of surface-modified polysterene microspheres by an azo-initiator having analogous structure to the head group of phosphatidylcholine", Macromol. Chem. Phys. vol. 195, 1994, pp. 1341-1352.
Thurn-Albrecht et al., "Ultrahigh-Density Nanowire Arrays Grown in Self-Assembled. Diblock Copolymer Templates", Science vol. 290, Dec. 15, 2000, pp. 2126-2129.
Yamaguchi et al., "Resist-Pattern Guided Self-Assembly of Symmetric Diblock Copolymer", Journal of Photopolymer Science and Technology vol. 19 No. 3, 2006, pp. 385-388.
Yamaguchi et al., "Two-Dimensional Patterning of Flexible Designs with High Half-Pitch Resolution by Using Block Copolymer Lithography", Advanced Materials vol. 20 Issue 9, 2008, pp. 1684-1689.
Yu et al., "The synthesis of novel fluorine-containing random polymer and application in modification of solid surfaces", Surface & Coatings Technology 205, 2010, pp. 205-212.

* cited by examiner

Random copolymer:

(Ia) 50 mole % ; (IIa) 30 mole %; (IIIa) 20 mole %

(Ia)

(IIa)

(IIIa)

Random copolymer:

(Ia) 48 mole % ; (IIa) 30 mole %; (IIIa) 20 mole %; (IVb) 2 mole %

(Ia)

(IIa)

(IIIa)

(IVb)

Random copolymer: (Ia) 68 mole %; (IIa) 10 mole %; (IIIa) 20 mole %; (IVb) 2 mole %

(Ia)

(IIa)

(IIIa)

(IVb)

Blend of random copolymer Example 2 and Rxample 4 in 60:40 wt ratio to form contact hole

RAPID CROSS-LINKABLE NEUTRAL UNDERLAYERS FOR CONTACT HOLE SELF-ASSEMBLY OF POLYSTYRENE-B-POLY(METHYL METHACRYLATE) DIBLOCK COPOLYMERS AND THEIR FORMULATION THEREOF

This application is a national stage application, filed under 35 U.S.C. § 371, of International Patent Application No. PCT/EP2019/083589, filed on Dec. 4, 2019, which claims the benefit of U.S. Provisional Patent Application No. 62/776,802, filed Dec. 7, 2018, each of which applications is incorporated herein by reference in their entirety.

FIELD OF THE INVENTION

The invention relates to novel neutral layer compositions and novel methods for using the neutral layer compositions for aligning microdomains of self-assembling block copolymers (BCP) to form self-assembled geometries which are useful for forming arrays of contact holes or posts. These compositions and processes are useful for fabrication of electronic devices.

BACKGROUND

Self-assembly of block copolymers is a method useful for generating smaller and smaller patterned features for the manufacture of microelectronic devices in which the critical dimensions (CD) of features on the order of nanoscale can be achieved. Self-assembly methods are desirable for extending the resolution capabilities of microlithographic technology for repeating features such as an array of contact holes or posts. In a conventional lithography approach, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high-density patterns.

In one aspect of the self-assembly method, a block copolymer can self organize on an inorganic or semiconductor substrate [(e.g. Si, GaAs, and the like), metal (Cu, W, Mo, Al, Zr, Ti, Hf, Au and the like) and metal oxide (Copper oxide, Aluminum oxide, Hafnium oxide, Zirconium oxide, Titanium oxide and the like] that is unpatterned to form nanophase segregated arrays of cylinders which are perpendicular to the substrate which are either rich in only one of the block of the block copolymer. For example, a diblock copolymer which is capable of nanophase segregation and comprises a block rich in carbon (such as styrene or containing some other element like Si, Ge, Ti) which is resistant to plasma etch, and a block which is highly plasma etchable or removable, can be induced on an inorganic or semiconductor substrate to form nanophase segregated cylinders which are perpendicular to the substrate and contain these etch resistant blocks. Alternatively, with a different inorganic or semiconductor substrate or a different block copolymer, the perpendicular cylinder formed may be induced to be ones which are rich in the plasma etchable block. Upon plasma etching, (e.g. oxygen plasma), a self-assembled array of etch resistant perpendicular cylinders will form pillars in the etched substrate, while conversely an array of highly etchable perpendicular cylinders will form an array of contact holes in the etched substrate. Examples of highly etchable blocks can comprise monomers which are rich in oxygen and which do not contain refractory elements and can form blocks which are highly etchable, such as methyl methacrylate. The plasma etching gases used in the etching process of defining the self-assembly pattern typically are those used in processes employed to make integrated circuits (IC). In this manner, potentially, fine patterns could be etched in typical IC substrates achieving an array either pillars or contact holes. Unfortunately, self-assembly of block copolymers on bare semiconductor substrates and inorganic substrates either does not form the required perpendicular cylindrical nanophase segregated arrays, or does so with high levels of defects, in the repeatability of the array, which are unacceptable for IC manufacturing.

Neutral layers are layers on a substrate or the surface of a treated substrate which have no affinity for either of the block segment of a block copolymer and are employed in directed self-assembly approaches employing either the chemoepitaxy or graphoepitaxy approaches to affect for instance line multiplication of an initial topographical line in the substrate (graphoepitaxy) or line multiplication of a chemical substrate surface difference having no significant topography aspect (chemoepitaxy). In these directed self-assembly approaches these Neutral layers, may be attached to a substrate either by for instance, grafting a neutral layer polymer with a reactive end group (brush layer approach), crosslinking a neutral layer containing crosslinking groups a substrate to form (MAT layer approach) or both grafting and crosslinking a neutral layer on a substrate using a neutral layer polymer containing both a reactive end group and crosslinking group to form a layer which is both grafted and crosslinked.

There is a need for a neutral layer composition which may be coated on a semiconductor or inorganic substrate [(e.g. Si, GaAs, and the like), metal (Cu, W, Mo, Al, Zr, Ti, Hf, Au and the like) and metal oxide (Copper oxide, Aluminum oxide, Hafnium oxide, Zirconium oxide, Titanium oxide and the like], rapidly cured in a minute or less, does not require a rinse step to form a neutral layer able to affect self-assembly of a block copolymer subsequently coated on it to form a self-assembled nanophase segregated arrays capable of transferring a contact hole array or a post array, into a substrate, using an etching process having low levels of defects acceptable to IC manufacturing.

The present invention relates to novel crosslinking polymers and compositions of these in a solvent which can be coated on an inorganic or semiconductor substrate, baked and rapidly (about minute or less) form a crosslinked MAT neutral layer on this substrate. Moreover, this MAT neutral layer when coated with a given block copolymer is used to self-assemble a given block copolymer during annealing to form low defect or defect free arrays of either etch resistant cylinders or etchable cylinder perpendicular to the substrate. These arrays, after plasma etching can be used to form low defect arrays of either cylinder or contact holes in the substrate, which also have either no defects or low levels of defect acceptable for IC manufacturing.

DETAILED DESCRIPTION OF DRAWINGS

Figure 2:
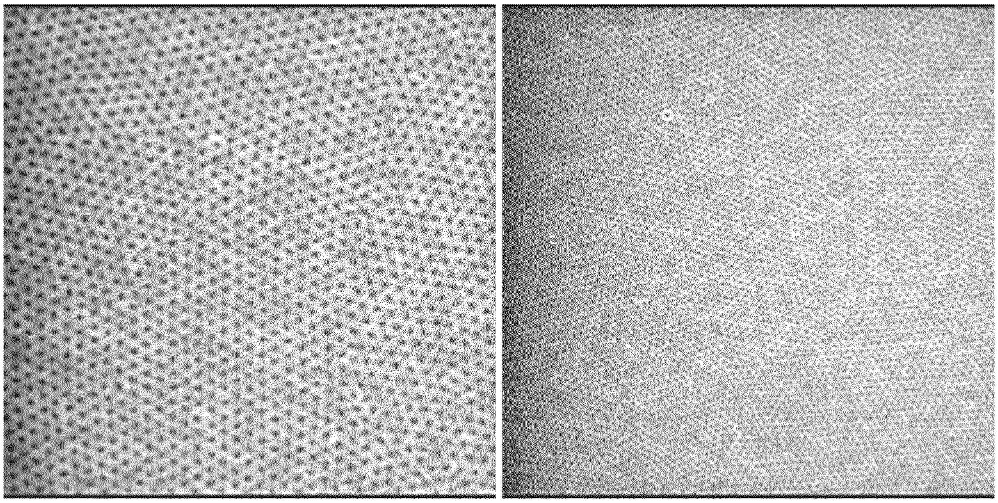
Figure 2:
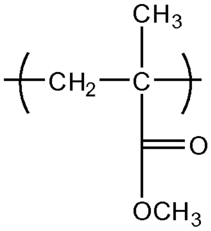
Figure 2:
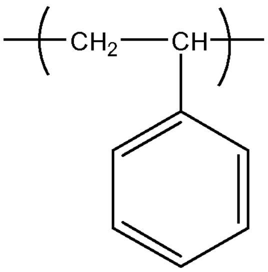
Figure 2:
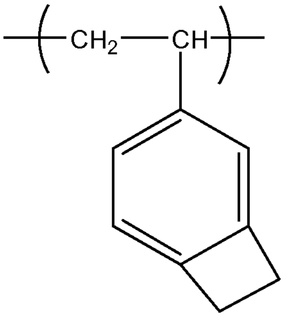
Figure 2:
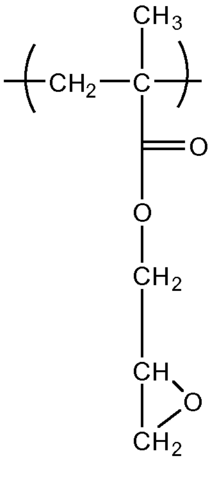

FIG. 1 SEM photograph of a self-assembled block copolymer film showing that the same block copolymer of polystyrene and methyl methacrylate as used in FIG. 2 is not able to form an array which is a precursor for etch pattern transfer into the substrate of a contact hole array if it is coated on a film of a random copolymer whose repeat units only consist of repeat units of structures (Ia) 50 mole %; (IIa) 30 mole %; (IIIa) 20 mole %, and does not contain repeat unit of structure (IV).

FIG. 2. SEM photograph of self-assembled film of a block copolymer of styrene and methyl methacrylate forming an array which is a precursor for etch pattern transfer into the substrate of a contact hole array; the self-assemble film was formed by annealing the film over a crosslinked neutral layer film formed from a random copolymer of styrene and methyl methacrylate on a crosslinked neutral layer formed from the random copolymer whose repeat units are ones of structures (Ia) 48 mole %; (IIa) 30 mole %; (IIIa) 20 mole %; and (IVb) 2 mole %.

Figure 3:
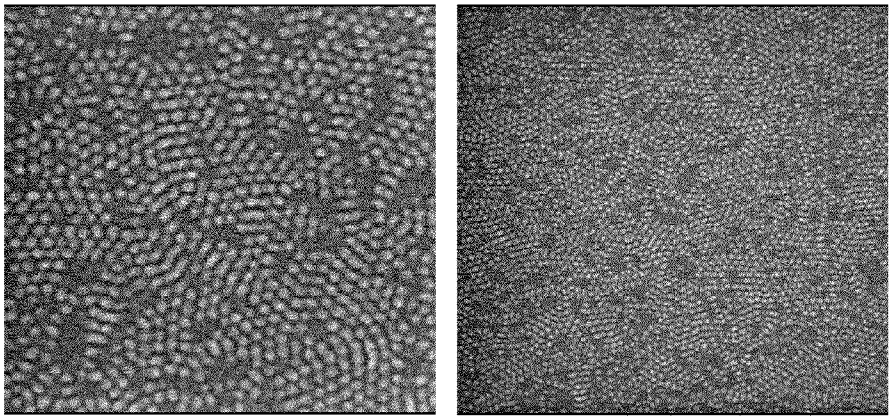
Figure 3:
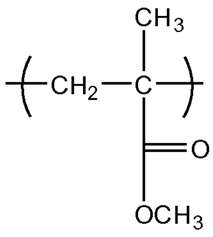
Figure 3:
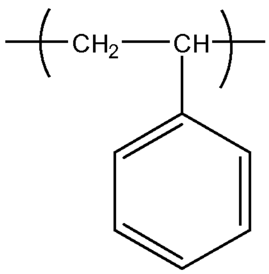
Figure 3:
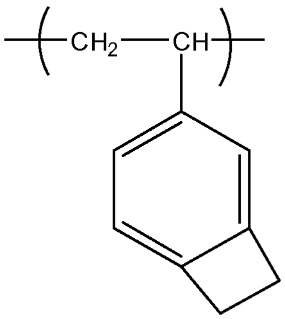
Figure 3:
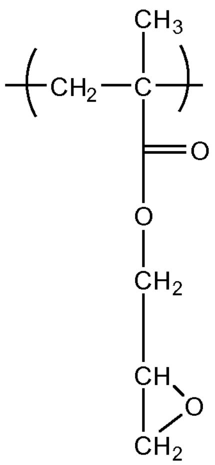

FIG. 3. SEM photograph of self-assembled film of a block copolymer of styrene and methyl methacrylate forming an array which is a precursor for etch pattern transfer into the substrate of a post array; the self-assemble film was formed by annealing the film over a crosslinked neutral layer film formed from a random copolymer of styrene and methyl methacrylate on a crosslinked neutral layer formed from the random copolymer from the random copolymer whose repeat units are ones of structures (Ia) 68 mole %; (IIa) 10 mole %; (IIIa) 20 mole %; and (IVb) 2 mole %.

Figure 4:
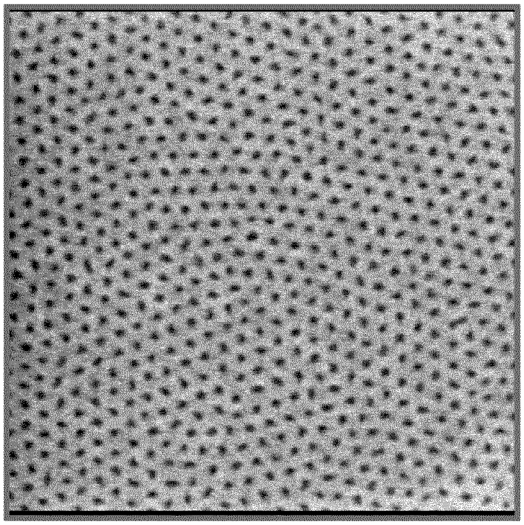

FIG. 4. SEM photograph of self-assembled block copolymer film of styrene and methyl methacrylate forming an array which is a precursor for etch pattern transfer into the substrate of a contact hole array; the self-assemble film was formed by annealing the film over a crosslinked neutral layer film formed from a random copolymer of polystyrene and methyl methacrylate on a crosslinked neutral layer formed from the blend of random copolymer: repeat units of structures (Ia) 40 mole %; (IIa) 38 mole %; (IIIa) 20 mole %; and (IVb) 2 mole % after blending.

Figure 5:
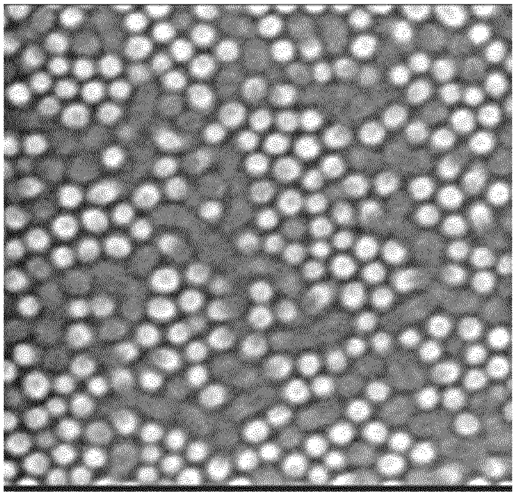

FIG. 5. SEM photograph of self-assembled block copolymer film of styrene and methyl methacrylate forming an array which is a precursor for etch pattern transfer into the substrate of a contact post array; the self-assemble film was formed by annealing the film over a crosslinked neutral layer film formed from a blend of random copolymer of polystyrene and methyl methacrylate on a crosslinked neutral layer: repeat units of structures (Ia) 63 mole %; (IIa) 15 mole %; (IIIa) 20 mole %; and (IVb) 2 mole % after blending.

Figure 6:
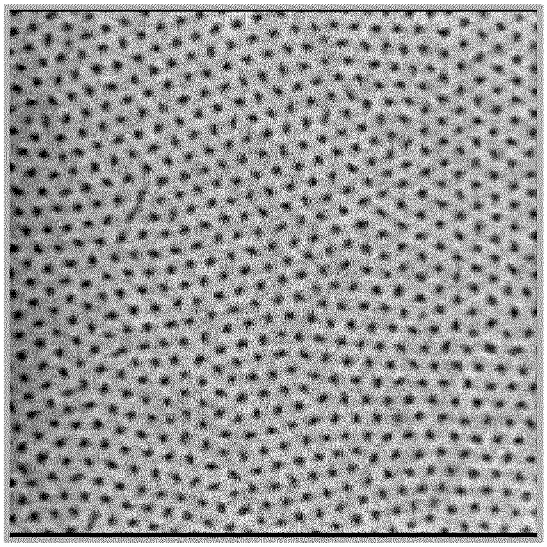

FIG. 6. SEM photograph of self-assembled block copolymer film of styrene and methyl methacrylate forming an array which is a precursor for etch pattern transfer into the substrate of a contact hole array; the self-assemble film was obtained from a blend of high molecular weight BCP and low molecular weight BCP's and by annealing the film over a crosslinked neutral layer film formed from a random copolymer of polystyrene and methyl methacrylate on a crosslinked neutral layer of random copolymer: repeat units of structures (Ia) 48 mole %; (IIa) 30 mole %; (IIIa) 20 mole %; and (IVb) 2 mole %.

Figure 7:
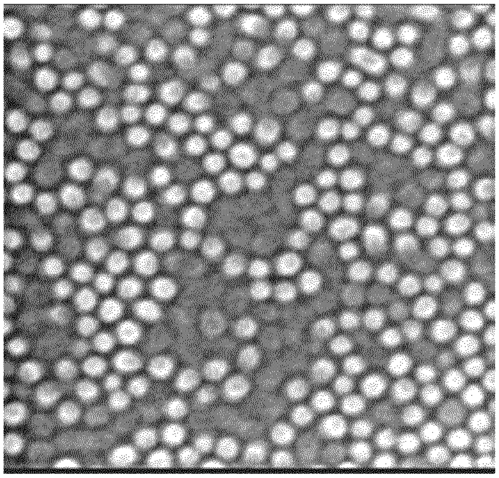

FIG. 7. SEM photograph of self-assembled block copolymer film of styrene and methyl methacrylate forming an array which is a precursor for etch pattern transfer into the substrate of a post array; the self-assemble film was obtained from a blend of high molecular weight BCP and low molecular weight BCP's and by annealing the film over a crosslinked neutral layer film formed from a random copolymer of polystyrene and methyl methacrylate on a crosslinked neutral layer of random copolymer: repeat units of structures (Ia) 68 mole %; (IIa) 10 mole %; (IIIa) 20 mole %; and (IVb) 2 mole %.

SUMMARY OF INVENTION

The present invention relates to a random copolymer comprising the following repeat units of structure (I), (II), (III), and (IV), wherein:

$R_1$ is selected from the group consisting of a C-1 to C-4 alkyl, $R_2$, $R_3$, $R_5$, and $R_6$ are independently selected from the group consisting of H, a C-1 to C-4 alkyl, $R_4$ is a C-1 to C-4 alkyl, and n is an integer from 0 to 5, and $R_7$ is an alkylene selected from the group consisting of C-1 to C-4 alkylene:

(I)

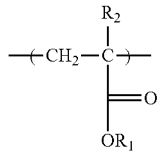

(II)

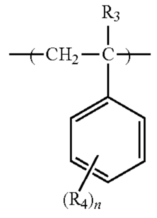

(III)

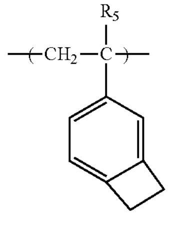

-continued (IV)

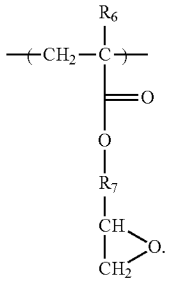

The present invention also relates to novel composition comprised of said inventive random copolymers which when coated and crosslinked on a substrate may form a crosslinked neutral layer. Further, this invention also pertains to the novel use of said crosslinked neutral layers, when overcoated with a film of a block copolymer containing etch resistant and etchable block, to affect annealing self-assembly of said block copolymer film forming a repeating pattern, which when etched may form either an array of contact holes or an array of posts in said substrate.

DETAILED DESCRIPTION OF THE INVENTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term (meth)acrylate is a term which embodies in one term both acrylate and methacrylate.

The term C-1 to C-4 alkyl embodies methyl and C-2 to C-4 linear alkyls and C-3 to C-4 branched alkyl moieties, for example as follows: methyl($—CH_3$), ethyl ($—CH_2—CH_3$), n-propyl ($—CH_2—CH_2—CH_3$), isopropyl ($—CH(CH_3)_2$, n-butyl ($—CH_2—CH_2—CH_2—CH_3$), tert-butyl ($—C(CH_3)_3$), isobutyl ($CH_2—CH(CH_3)_2$, 2-butyl ($—CH(CH_3)CH_2—CH_3$). Similarly, the term C-1 to C-8 embodies methyl C-2 to C-8 linear, C-3 to C-8 branched alkyls, C-4 to C-8 cycloalkyls (e.g. cyclopentyl, cyclohexyl etc) or C-5-C-8 alkylenecycloalkyls (e.g. $—CH_2$-cyclohexyl, $CH_2—CH_2$-cyclopentyl etc.

The term C-1 to C-4 alkylene embodies methylene and C-2 to C-4 linear alkylene moieties (e.g. ethylene, propylene etc.) and C-3 to C-4 branched alkylene moieties (e.g. —CH(CH3)-, $—CH(CH_3)—CH_2—$, etc.).

As described herein, the terms "post," and "pillar," are synonymous.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

The present invention relates to novel neutral layer compositions and novel self-directed assembly processes for forming a repeating array of contact holes or posts with high resolution and good lithographic properties. The novel composition can form a crosslinked neutral layer for use with self-assembly of block copolymers. The neutral layer is an orientation control layer which allows the block copolymer coated above the neutral layer to align such that the different block form a repeating pattern on the substrate which is able after etching to form either a contact hole array or to the substrate for obtaining high resolution lithography.

In one aspect the invention relates to a random copolymer comprising the following repeat units of structure (I), (II), (III), and (IV) wherein, $R_1$ is selected from the group consisting of a C-1 to C-4 alkyl, $R_2$, $R_3$, $R_5$, and $R_6$ are independently selected from the group consisting of H, a C-1 to C-4 alkyl, $R_4$ is a C-1 to C-4 alkyl, and n is an integer from 0 to 5, and $R_7$ is an alkylene is selected from the group consisting of C-1 to C-4 alkylene:

(I)

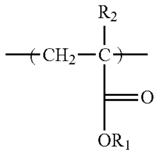

(II)

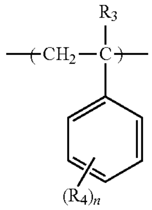

(III)

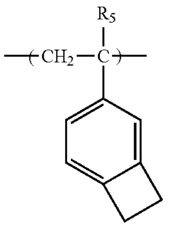

-continued (IV)

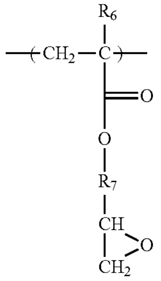

In another aspect of the above random copolymer according it is one consisting essentially of repeat units of structures (I), (II), (III), and (IV).

In any of the above aspects of the random copolymer it is wherein each polymer chain of said random copolymer further comprises a first end group, which is a benzylic alcohol comprising moiety of structure (V), wherein n' is an integer and ranges from 1 to 5; n" is an integer and ranges from 1 to 5; n'" is an integer and ranges from 1 to 5; $R_8$ is a C-1 to C-8 alkyl; X is —CN or an alkyloxycarbonyl moiety $R_9$—O—(C═O)— where $R_9$ is a C-1 to C-8 alkyl; and ~~~ represents the attachment point of said end group to said random copolymer.

(V)

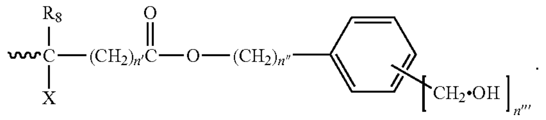

In another aspect of any of the inventive random copolymer described above, it is one, wherein the repeat units are ones wherein, n is 0, $R_2$ and $R_6$ are independently selected from the group consisting of $CH_3$, and H, $R_3$ and $R_5$ are H, $R_7$ is a C-1 to C-3 alkylene. In another aspect of this embodiment $R_1$ is methyl. In yet another embodiment $R_2$ is methyl. In still another aspect of said $R_3$ is H. In another aspect $R_5$ is H. In yet another aspect $R_6$ is methyl. In still another $R_7$ is methylene.

In another aspect of any of the inventive random copolymer described above, it is one, wherein the repeat units are ones wherein $R_1$, $R_2$, and $R_6$ are methyl, $R_3$ and $R_5$ are H, $R_7$ is methylene and n=0.

In another aspect of any of the inventive random copolymer described above, said first end group is one wherein X is CN having the more specific structure (Va), wherein ~~~ represents the attachment point of said end group to said random copolymer and the other variables are as described above:

(Va)

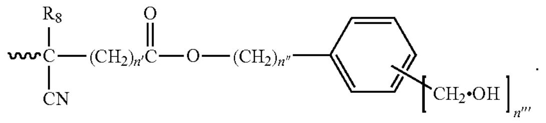

In another aspect of any of the inventive random copolymer described above, wherein each polymer chain further comprises said first end group is one having the more specific structure (Vb), wherein ~~~ represents the attachment point of said end group to said random copolymer and the other variables are as described above:

(Vb)

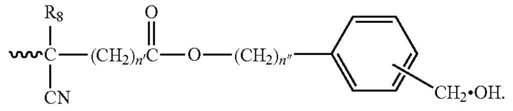

In another aspect of any of the inventive random copolymer described above, said first end group is one having the more specific structure (Vc), wherein ~~~ represents the attachment point of said end group to said random copolymer and the other variables are as described above:

(Vc)

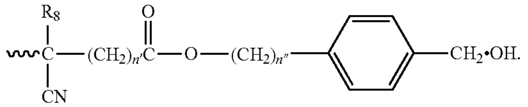

In another aspect of any of the inventive random copolymer described above, said first end group is one having the more specific structure (Vd), wherein ~~~ represents the attachment point of said end group to said random copolymer:

(Vd)

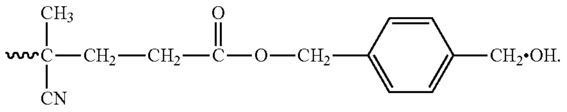

In another aspect of any of the random copolymers wherein said random copolymer further comprises in each polymer chain, in addition to said first end group, a second end group which is selected from H and a C-1 to C-4 alkyl moiety. In another aspect of this embodiment it is a C-1 to C-4 alkyl moiety. In yet another aspect of this embodiment it is H.

In another aspect of any of the above random copolymer it is one wherein, based on the total moles of repeat units present in said random copolymer, the repeat unit of structure (I) ranges from about 28 mole % to about 78 mole %.

In another aspect of any of the above random copolymer it is one wherein, based on the total moles of repeat units present in said random copolymer, the repeat unit of structure (II) ranges from about 5 mole % to about 70 mole %.

In another aspect of any of the above random copolymer it is one wherein, based on the total moles of repeat units present in said random copolymer, the repeat unit of structure (III) ranges from about 15 mole % to about 25 mole %.

In another aspect of any of the above random copolymer it is one wherein, based on the total moles of repeat units present in said random copolymer, the repeat unit of structure (IV) ranges from about 0.5 mole % to about 3 mole %.

In another aspect of any of the above random copolymer it is one wherein for each repeat unit, its mole % based on the total moles of all repeat units in said random copolymer is individually selected from the following ranges, and each mole % is individually selected from these ranges such that the sum of all the repeat units mole % values for all the repeat units present in said random copolymer equals 100 mole %: The repeat unit of structure (I) ranges from about 28 mole % to about 78 mole %, the repeat unit of structure (II) ranges from about 5 mole % to about 70 mole %, the repeat unit of structure (III) ranges from about 15 mole % to about 25 mole %, and the repeat unit of structure (IV) ranges from about 0.5 mole % to about 3 mole %. These ranges encompass compositions which may be used, depending on the specific mole % selected from these ranges to produce after coating on a substrate and crosslinking a neutral layer which will direct an annealed overlying block copolymer film to produce a self-assembled pattern which will affect, after etching, either a contact hole array or a post array in an underlying substrate.

In another aspect of any of the above random copolymer it is one wherein, based on the total moles of repeat units present in said random copolymer, the repeat unit of structure (I) ranges from about 28 mole % to about 58 mole %.

In another aspect of any of the above random copolymer it is one wherein, based on the total moles of repeat units present in said random copolymer, the repeat unit of structure (II) ranges from about 20 mole % to about 40 mole %.

In another aspect of any of the above random copolymer it is one wherein, based on the total moles of repeat units present in said random copolymer, the repeat unit of structure (III) ranges from about 15 mole % to about 25 mole %.

In another aspect of any of the above random copolymer it is one wherein, based on the total moles of repeat units present in said random copolymer, the repeat unit of structure (IV) ranges from about 0.5 mole % to about 3 mole %.

In another aspect of any of the above random copolymer it is one wherein, based on the total moles of repeat units present in said random copolymer, the mole % sum of repeat unit of structure (II) and (III) ranges from about 40 mole % to about 65 mole %, and each mole % for these repeat units are individually selected such that the sum of all the repeat units mole % values for the repeat units present in said random copolymers equals 100 mole %.

In another aspect of any of the above random copolymer it is one wherein for each repeat unit, its mole % based on the total moles of all repeat units in said random copolymer is individually selected from the following ranges, and each mole % is individually selected from these ranges such that the sum of all the repeat units mole % values for all the repeat units present in said random copolymer equals 100 mole %: The repeat unit of structure (I) ranges from about 28 mole % to about 58 mole %, the repeat unit of structure (II) ranges from about 20 mole % to about 40 mole %, the repeat unit of structure (III) ranges from about 15 mole % to about 25 mole %, and the repeat unit of structure (IV) ranges from about 0.5 mole % to about 3 mole %, and the mole % sum of repeat unit of structure (II) and (III) ranges from about 40 mole % to about 65 mole %. These ranges encompass compositions which may be used, to produce after coating on a substrate and crosslinking a neutral layer which will direct an annealed overlying block copolymer film to produce a self-assembled pattern which, after etching, produce a contact hole array in an underlying substrate.

In another aspect of any of the above random copolymer it is one wherein, based on the total moles of repeat units present in said random copolymer, the repeat unit of structure (I) ranges from about 35 mole % to about 55 mole %.

In another aspect of any of the above random copolymer it is one wherein, based on the total moles of repeat units present in said random copolymer, the repeat unit of structure (II) ranges from about 25 mole % to about 35 mole %.

In another aspect of any of the above random copolymer it is one wherein, based on the total moles of repeat units present in said random copolymer, the repeat unit of structure (III) ranges from about 18 mole % to about 22 mole %.

In another aspect of any of the above random copolymer it is one wherein, based on the total moles of repeat units present in said random copolymer, the repeat unit of structure (IV) ranges from about 1 mole % to about 2.5 mole %.

In another aspect of any of the above random copolymer it is one wherein, based on the total moles of repeat units present in said random copolymer, the mole % sum of repeat unit of structure (II) and (III) ranges from about 40 mole % to about 60 mole %, and each mole % for these repeat units are individually selected such that the sum of all the repeat units mole % values for the repeat units present in said random copolymers equals 100 mole %.

In another aspect of any of the above random copolymer it is one wherein for each repeat unit, its mole % based on the total moles of all repeat units in said random copolymer is individually selected from the following ranges, and each mole % is individually selected from these ranges such that the sum of all the repeat units mole % values for all the repeat units present in said random copolymer equals 100 mole %: The repeat unit of structure (I) ranges from about 35 mole % to about 55 mole %, the repeat unit of structure (II) ranges from about 25 mole % to about 35 mole %, the repeat unit of structure (III) ranges from about 18 mole % to about 22 mole %, and the repeat unit of structure (IV) ranges from about 1 mole % to about 2.5 mole % the mole % sum of repeat unit of structure (II) and (III) ranges from about 40 mole % to about 60 mole %. These ranges encompass compositions which may be used, to produce after coating on a substrate and crosslinking a neutral layer which will direct an annealed overlying block copolymer film to produce a self-assembled pattern which, after etching, produce a contact hole array in an underlying substrate. In another aspect of any of the above random copolymer it is one wherein, based on the total moles of repeat units present in said random copolymer, the repeat unit of structure (I) ranges from about 28 mole % to about 78 mole %.

In another aspect of any of the above random copolymer it is one wherein for each repeat unit, its mole % based on the total moles of all repeat units in said random copolymer is individually selected from the following ranges, and each mole % is individually selected from these ranges such that the sum of all the repeat units mole % values for all the repeat units present in said random copolymer equals 100 mole %: The repeat unit of structure (I) ranges from about 35 mole % to about 55 mole %, the repeat unit of structure (II) ranges from about 22 mole % to about 35 mole %, the repeat unit of structure (III) ranges from about 18 mole % to about 25 mole %, and the repeat unit of structure (IV) ranges from about 1 mole % to about 2.5 mole % the mole % sum of repeat unit of structure (II) and (III) ranges from about 40 mole % to about 60 mole %. These ranges encompass compositions which may be used, to produce after coating on a substrate and crosslinking a neutral layer which will direct an annealed overlying block copolymer film to produce a self-assembled pattern which, after etching, produce a contact hole array in an underlying substrate. In another aspect of any of the above random copolymer it is one wherein, based on the total moles of repeat units present in said random copolymer, the repeat unit of structure (I) ranges from about 28 mole % to about 78 mole %.

In another aspect of any of the above random copolymer it is one wherein, based on the total moles of repeat units present in said random copolymer, the repeat unit of structure (II) ranges from about 5 mole % to about 70 mole %.

In another aspect of any of the above random copolymer it is one wherein, based on the total moles of repeat units present in said random copolymer, the repeat unit of structure (III) ranges from about 15 mole % to about 25 mole %.

In another aspect of any of the above random copolymer it is one wherein, based on the total moles of repeat units present in said random copolymer, the repeat unit of structure (IV) ranges from about 0.5 mole % to about 3 mole %.

In another aspect of any of the above random copolymer it is one wherein, based on the total moles of repeat units present in said random copolymer, the mole % sum of repeat unit of structure (II) and (III) ranges from about 20 mole % to about 45 mole %, and each mole % for these repeat units are individually selected such that the sum of all the repeat units mole % values for the repeat units present in said random copolymers equals 100 mole %.

In another aspect of any of the above random copolymer it is one wherein for each repeat unit, its mole % based on the total moles of all repeat units in said random copolymer is individually selected from the following ranges, and each mole % is individually selected from these ranges such that the sum of all the repeat units mole % values for all the repeat units present in said random copolymer equals 100 mole %: The repeat unit of structure (I) ranges from about 48 mole % to about 78 mole %, the repeat unit of structure (II) ranges from about 5 mole % to about 20 mole %, the repeat unit of structure (III) ranges from about 15 mole % to about 25 mole %, and the repeat unit of structure (IV) ranges from about 0.5 mole % to about 3 mole %, and the mole % sum of repeat unit of structure (II) and (III) ranges from about 20 mole % to about 45 mole %. These ranges encompass compositions which may be used, to produce after coating on a substrate and crosslinking a neutral layer which will direct an annealed overlying block copolymer film to produce a self-assembled pattern which, after etching, produce a post array in an underlying substrate.

In another aspect of any of the above random copolymer it is one wherein, based on the total moles of repeat units present in said random copolymer, the repeat unit of structure (I) ranges from about 50 mole % to about 70 mole %.

In another aspect of any of the above random copolymer it is one wherein, based on the total moles of repeat units present in said random copolymer, the repeat unit of structure (II) ranges from about 7 mole % to about 15 mole %

In another aspect of any of the above random copolymer it is one wherein, based on the total moles of repeat units present in said random copolymer, the repeat unit of structure (III) ranges from about 18 mole % to about 22 mole %.

In another aspect of any of the above random copolymer it is one wherein, based on the total moles of repeat units present in said random copolymer, the repeat unit of structure (IV) ranges from about 1 mole % to about 2.5 mole %.

In another aspect of any of the above random copolymer it is one wherein, based on the total moles of repeat units present in said random copolymer, the mole % sum of repeat unit of structure (II) and (III) ranges from about 25 mole % to about 35 mole %, and each mole % for these repeat units are individually selected such that the sum of all the repeat units mole % values for the repeat units present in said random copolymers equals 100 mole %.

In another aspect of any of the above random copolymer it is one wherein for each repeat unit, its mole % based on the total moles of all repeat units in said random copolymer is individually selected from the following ranges, and each mole % is individually selected from these ranges such that the sum of all the repeat units mole % values for all the repeat units present in said random copolymer equals 100 mole %: The repeat unit of structure (I) ranges from about 50 mole % to about 70 mole %, the repeat unit of structure (II) ranges from about 7 mole % to about 15 mole %, the repeat unit of structure (III) ranges from about 18 mole % to about 22 mole %, and the repeat unit of structure (IV) ranges from about 1 mole % to about 2.5 mole %, and the mole % sum of repeat unit of structure (II) and (III) ranges from about 25 mole % to about 35 mole %. These ranges encompass compositions which may be used, to produce after coating on a substrate and crosslinking a neutral layer which will direct an annealed overlying block copolymer film to produce a self-assembled pattern which, after etching, produce a post array in an underlying substrate.

In another aspect of this inventive random copolymer it is any of the above described random copolymers wherein the weight average molecular weight ($M_w$) ranges from about 20,000 g/mole to about 50,000 g/mole, and the polydispersity ($M_w/M_n$) ranges from about 1.3 to about 1.8. In another aspect of this embodiment the weight average molecular weight ranges from about 25,000 g/mole to about 45,000 g/mole, and the polydispersity ranges from about 1.3 to about 1.8.

The inventive random copolymer embodiments, described above, which do not contain one benzylic alcohol moiety comprising end group may be prepared by a variety of ways by which alkene containing monomers can be polymerized randomly (such as nitroxide mediated polymerization, cationic, anionic condensation chain polymerization and the like) but generally they are prepared by radical polymerization such as the ones initiated by free radical initiators such as AIBN (azobisisobutyronitrile), benzoyl peroxide or other standard thermal radical initiators. Specifically, to produce these random copolymer embodiments, these type of initiators would be reacted with a mixture comprising monomers having structures (Im), (IIm), (IIIm) and (IVm), wherein $R_1$, $R_2$, $R_3$, $R_4$, $R_5$, $R_6$, and $R_7$ are as previously defined for the corresponding repeat units having structure (I), (II), (III), and (IV) in the different embodiments for the inventive random copolymer. Using such initiators will produce embodiments of the inventive random copolymer which has two different types of crosslinking moieties, namely the benzocyclobutene of repeat unit of structure (III) and the epoxide of repeat unit of structure (IV).

(Im)

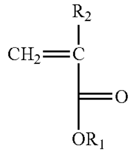

(IIm)

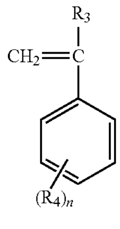

(IIIm)

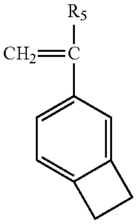

-continued (IVm)

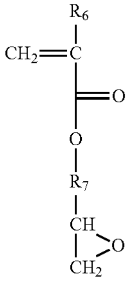

In the embodiments of the inventive random copolymers described above which contain one benzylic alcohol moiety comprising end group, these may be made by reacting a diazo initiator, comprising two benzyl alcohol moieties, having structure (VI) with a mixture comprising the above described monomers of structures (Im), (IIm), (IIIm) and (IVm). In structure (VI) ni' ranges from 1 to 5; ni" ranges from 1 to 5; ni'" ranges from 1 to 5; $R_{8i}$ is a C-1 to C-8 alkyl; Xi is —CN or an alkyloxycarbonyl moiety $R_{9i}$—O—(C═O)— where $R_{9i}$ is a C-1 to C-8 alkyl. Thus, radical initiators of structure (VI) when reacted with monomers of structures (Im), (IIm), (IIIm) and (IVm) will produce the embodiment of the inventive random copolymer will produced the embodiments of this material in which a single end group of structures (V) is present in each polymer chain and where the other second end group is H.

(VI)

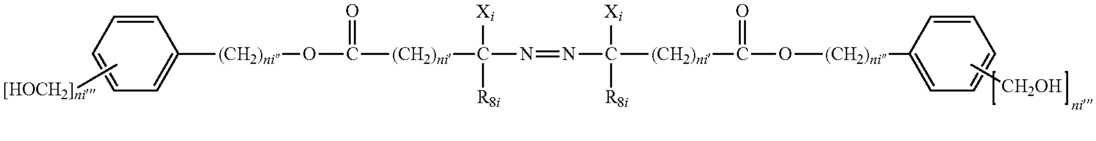

If a radical initiator of structure (VIa) is reacted with a mixture of the monomers, of structures (Im), (IIm), (IIIm), and (IVm), this will produced the embodiments of the inventive random copolymer, described above, wherein a single end group of structure (Va) is present in each polymer chain formed, and wherein the other end group is H. In Structure (VIa), $R_{8i}$, ni'", ni" and ni' are as defined above.

(VIa)

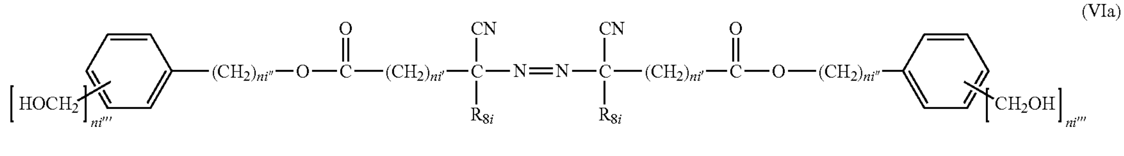

If a radical initiator of structure (VIb) is reacted with a mixture of the monomers, of structures (Im), (IIm), (IIIm), and (IVm), this will produce the embodiments of the inventive random copolymer described above wherein a single end group of structure (Vb) is present in each polymer chain formed, and wherein the other end group is H. In Structure (VIb), $R_{8i}$, ni" and ni' are as defined above.

(VIb)

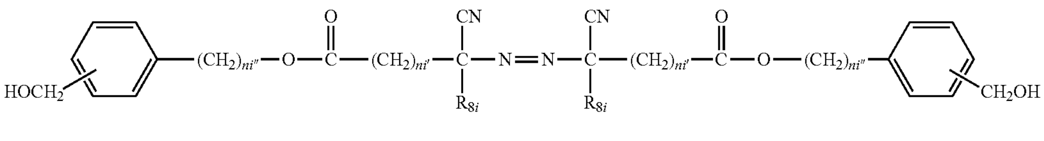

If a radical initiator of structure (VIc) is reacted with a mixture of the monomers, of structures (Im), (IIm), (IIIm), and (IVm), this will produce the embodiments of the inventive random copolymer described above wherein a single end group of structure (Vc) is present in each polymer chain formed, and wherein the other end group is H. In Structure (VIc), $R_{8i}$, ni" and ni' are as defined above.

(VIc)

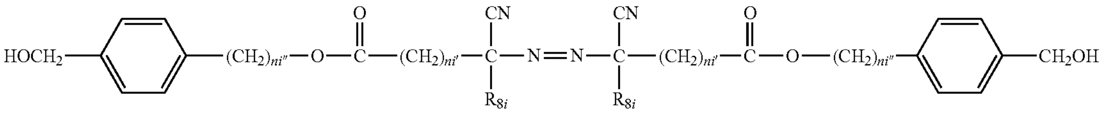

If a radical initiator of structure (VId) is reacted with a mixture of the monomers, of structures (Im), (IIm), (IIIm), and (IVm), this will produce the embodiments of the inventive random copolymer described above wherein a single end group of structure (Vd) is present in each polymer chain formed, and wherein the other end group is H.

(VId)

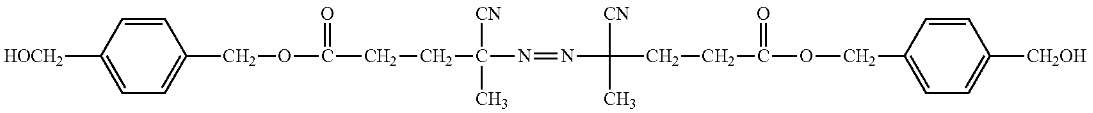

The diazo initiators of structures (VI), (VIa), (VIb), (VIc) or (VId) provide a hydrogen end group (—H) and an end group having a benzylic alcohol moiety when reacted with a mixture of monomers having structure (Im), (IIm), (IIIm), and (IVm). These embodiments of the inventive random copolymer have structures containing a single benzylic alcohol moiety chain end which can graft onto a substrate and also contain in the polymer chain two different types of crosslinking moieties, namely the benzocyclobutene moieties of repeat unit of structure (III) and the epoxide moieties of repeat unit of structure (IV).

The inventive random copolymers described above, when dissolved in spin casting solvent and cast on a substrate, produce a neutral layer which show no defects and may be used to affect self-assembly of an overlying block copolymer film to give patterns which may be used to pattern transfer using etching into the substrate an image comprising an array. Depending on the tuning of the inventive random copolymer and the overlying block copolymer this array may be either an array of posts or an array of holes.

The above materials also do not need to form a comb like architecture by grafting on a substrate through an end group but can simply be spun on as a conventional polymer without prior covalent attachment to the substrate surface forming a crosslinked MAT material. This avoids a step wherein film of the neutral layer is treated with a solvent to remove ungrafted material leaving only behind the comb like architecture of grafted material. Specifically, the embodiments of the inventive random copolymer which have no benzyl alcohol comprising end group, when dissolved in a solvent and coated on a substrate, will undergo only crosslinking during bake to form a neutral layer which is a crosslinked MAT by crosslinking of both the benzocyclobutene moieties of repeat unit (III) and the epoxide moieties of repeat unit (IV). The embodiments of the inventive random copolymer described above which have a benzyl alcohol comprising end group when dissolved in a solvent and coated on a substrate, will also undergo crosslinking during bake to form a neutral layer which is a crosslinked MAT by crosslinking of both the benzocyclobutene moieties of repeat unit (III) and the epoxide moieties of repeat unit (IV), but during this crosslinking may also undergo grafting to the substrate surface through the benzylic alcohol moieties, which may additionally improve adhesion to the substrate surface during subsequent processing such as self-assembly of the overlying block copolymer film and pattern transfer of the self-assembled block copolymer film into the substrate to form either a contact hole or a post array.

The inventive random copolymer may be used as a single polymer or as blends of copolymers with differing molecular weight, differing concentrations of the repeating units containing a benzocyclobutene pendant group ((III) such as repeat unit derived from 4-vinylbenzocyclobutene derived repeat unit), differing ratio of the epoxide containing repeating unit (IV such as the repeat unit derived from glycidyl methacrylate), or differing concentrations of repeat units having structure (I) (e.g. methyl methacrylate) or having structure (II) (e.g. styrene).

In one aspect the inventive composition it is one comprising any of the above described inventive random copolymers and a spin casting solvent as described below. In one aspect of this embodiment the inventive composition is one which comprises a blend of the inventive random copolymer, in another aspect the composition comprises a single inventive random copolymer.

In another aspect the inventive composition it is one comprising any of the above described inventive random copolymers, which are described as polymers suitable for formation of a contact hole array in a substrate, and a spin casting solvent as described below. In one aspect of this embodiment the inventive composition is one which comprises a blend of the inventive random copolymer, in another aspect the composition comprises a single inventive random copolymer.

In another aspect the inventive composition it is one comprising any of the above described inventive random copolymers, which are described as for formation of a contact hole array in a substrate, and a spin casting solvent, as described below. In one aspect of this embodiment the inventive composition is one which comprises a blend of the inventive random copolymer, in another aspect the composition comprises a single inventive random copolymer.

Another aspect of this invention are compositions which comprise a blend of at least two random copolymers of the invention, and a spin casting solvent, wherein, based on the total moles of repeat units present in the said blend, the repeat unit of structure (I) ranges from about 28 mole % to about 58 mole %.

Another aspect of this invention are compositions which comprise a blend of at least two random copolymers of the invention, and a spin casting solvent, wherein, based on the total moles of repeat units present in the said blend, the repeat unit of structure (II) ranges from about 20 mole % to about 40 mole %.

Another aspect of this invention are compositions which comprise a blend of at least two random copolymers of the invention, and a spin casting solvent, wherein, based on the total moles of repeat units present in the said blend, the repeat unit of structure (III) ranges from about 15 mole % to about 25 mole %.

Another aspect of this invention are compositions which comprise a blend of at least two random copolymers of the invention, and a spin casting solvent, wherein, based on the total moles of repeat units present in the said blend, the repeat unit of structure (IV) ranges from about 0.5 mole % to about 3 mole %.

Another aspect of this invention are compositions which comprise a blend of at least two random copolymers of the invention, and a spin casting solvent, wherein, based on the total moles of repeat units present in the said blend, the mole % sum of repeat unit of structure (II) and (III) individually ranges from about 40 mole % to about 65 mole %, and are selected such that the total mole % for all repeat units present in the blend equals 100 mole %.

Another aspect of this invention are compositions which comprise a blend of at least two random copolymers of the invention, and a spin casting solvent, wherein, based on the total moles of repeat units present in the said blend, the repeat unit of structure (I) ranges from about 28 mole % to about 58 mole %.

Another aspect of this invention are compositions which comprise a blend of at least two random copolymers of the invention, and a spin casting solvent, wherein, based on the total moles of repeat units present in the said blend, the repeat unit of structure (II) ranges from about 20 mole % to about 40 mole %.

Another aspect of this invention are compositions which comprise a blend of at least two random copolymers of the invention, and a spin casting solvent, wherein, based on the total moles of repeat units present in the said blend, the repeat unit of structure (III) ranges from about 15 mole % to about 25 mole %.

Another aspect of this invention are compositions which comprise a blend of at least two random copolymers of the invention, and a spin casting solvent, wherein, based on the total moles of repeat units present in the said blend, the repeat unit of structure (IV) ranges from about 0.5 mole % to about 3 mole %.

Another aspect of this invention are compositions which comprise a blend of at least two random copolymers of the invention, and a spin casting solvent, wherein, based on the total moles of repeat units present in the said blend, the mole % sum of repeat unit of structure (II) and (III) individually ranges from about ranges from about 40 mole % to about 65 mole %, and and are selected such that the total mole % for all repeat units present in the blend equals 100 mole %.

Another aspect of this invention are compositions which comprise a blend of at least two random copolymers of the invention, and a spin casting solvent, wherein, based on the total moles of repeat units present in the said blend,

- the repeat unit of structure (I) ranges from about 28 mole % to about 58 mole %,
- the repeat unit of structure (II) ranges from about 20 mole % to about 40 mole %,
- the repeat unit of structure (III) ranges from about 15 mole % to about 25 mole %,
- the repeat unit of structure (IV) ranges from about 0.5 mole % to about 3 mole %,
- the mole % sum of repeat unit of structure (II) and (III) ranges from about 40 mole % to about 65 mole %, and
- each mole % for these repeat units are individually selected such that the sum of all the repeat unit mole % values for the repeat units present in said blend of random copolymers equals 100 mole %. These ranges encompass compositions which may be used, to produce after coating on a substrate and crosslinking a neutral layer which will direct an annealed overlying block copolymer film to produce a self-assembled pattern which, after etching, produce a contact hole array in an underlying substrate.

Another aspect of this invention are compositions which comprise a blend of at least two random copolymers of the invention, and a spin casting solvent, wherein, based on the total moles of repeat units present in the said blend, the repeat unit of structure (I) ranges from about 35 mole % to about 55 mole %.

Another aspect of this invention are compositions which comprise a blend of at least two random copolymers of the invention, and a spin casting solvent, wherein, based on the total moles of repeat units present in the said blend, the repeat unit of structure (II) ranges from about 25 mole % to about 35 mole %.

Another aspect of this invention are compositions which comprise a blend of at least two random copolymers of the invention, and a spin casting solvent, wherein, based on the total moles of repeat units present in the said blend, the repeat unit of structure (III) ranges from about 18 mole % to about 22 mole %.

Another aspect of this invention are compositions which comprise a blend of at least two random copolymers of the invention, and a spin casting solvent, wherein, based on the total moles of repeat units present in the said blend, the repeat unit of structure (IV) ranges from about 1 mole % to about 2.5 mole %.

Another aspect of this invention are compositions which comprise a blend of at least two random copolymers of the invention, and a spin casting solvent, wherein, based on the total moles of repeat units present in the said blend, the mole % sum of repeat unit of structure (II) and (III) ranges from about 40 mole % to about 60 mole %, and each mole % for these repeat units are individually selected such that the sum of all the repeat units mole % values for the repeat units present in said blend of random copolymers equals 100 mole %.

Another aspect of this invention are compositions which comprise a blend of at least two random copolymers of the invention, and a spin casting solvent, wherein, based on the total moles of repeat units present in the said blend,

- the repeat unit of structure (I) ranges from about 35 mole % to about 55 mole %,
- the repeat unit of structure (II) ranges from about 25 mole % to about 35 mole %,
- the repeat unit of structure (III) ranges from about 18 mole % to about 22 mole %,
- the repeat unit of structure (IV) ranges from about 1 mole % to about 2.5 mole %,
- the mole % sum of repeat unit of structure (II) and (III) ranges from about 40 mole % to about 60 mole %, and each mole % for these repeat units are individually selected such that the sum of all the repeat units mole % values for the repeat units present in said blend of random copolymers equals 100 mole %. These ranges encompass compositions which may be used, to produce after coating on a substrate and crosslinking a neutral layer which will direct an annealed overlying block copolymer film to produce a self-assembled pattern which, after etching, produce a contact hole array in an underlying substrate.

Another aspect of this invention are compositions which are comprised of a blend of at least two novel random copolymers, and a spin casting solvent, wherein, based on the total moles of repeat units present in the said blend,

- the repeat unit of structure (I) ranges from about 35 mole % to about 55 mole %,
- the repeat unit of structure (II) ranges from about 22 mole % to about 35 mole %,
- the repeat unit of structure (III) ranges from about 18 mole % to about 25 mole %,
- the repeat unit of structure (IV) ranges from about 1 mole % to about 2.5 mole %,
- the mole % sum of repeat unit of structure (II) and (III) ranges from about 40 mole % to about 60 mole %, and each mole % for these repeat units are individually selected such that the sum of all the repeat units mole % values for the repeat units present in said blend of random copolymers equals 100 mole %. These ranges encompass compositions which may be used, to produce after coating on a substrate and crosslinking a neutral layer which will direct an annealed overlying block copolymer film to produce a self-assembled pattern which, after etching, produce a contact hole array in an underlying substrate.

Another aspect of this invention are compositions which comprise a blend of at least two random copolymers of the invention, and a spin casting solvent, wherein, based on the total moles of repeat units present in the said blend, the repeat unit of structure (I) ranges from 48 mole % to about 78 mole %.

Another aspect of this invention are compositions which comprise a blend of at least two random copolymers of the invention, and a spin casting solvent, wherein, based on the total moles of repeat units present in the said blend, the repeat unit of structure (II) ranges 5 mole % to about 20 mole %.

Another aspect of this invention are compositions which comprise a blend of at least two random copolymers of the invention, and a spin casting solvent, wherein, based on the total moles of repeat units present in the said blend, the repeat unit of structure (III) ranges from about 15 mole % to about 25 mole %.

Another aspect of this invention are compositions which comprise a blend of at least two random copolymers of the invention, and a spin casting solvent, wherein, based on the total moles of repeat units present in the said blend, the repeat unit of structure (IV) ranges from 0.5 mole % to about 3 mole %.

Another aspect of this invention are compositions which comprise a blend of at least two random copolymers of the invention, and a spin casting solvent, wherein, based on the total moles of repeat units present in the said blend, the mole % sum of repeat unit of structure (II) and (III) from about 20 mole % to about 45 mole % and each mole % for these repeat units are individually selected such that the sum of all the repeat units mole % values for the repeat units present in said blend of random copolymers equals 100 mole %.

Another aspect of this invention are compositions which comprise a blend of at least two random copolymers of the invention, and a spin casting solvent, wherein, based on the total moles of repeat units present in the said blend,

- the repeat unit of structure (I) ranges from about 48 mole % to about 78 mole %,
- the repeat unit of structure (II) ranges from about 5 mole % to about 20 mole %,
- the repeat unit of structure (III) ranges from about 15 mole % to about 25 mole %,
- the repeat unit of structure (IV) ranges from about 0.5 mole % to about 3 mole %,
- the mole % sum of repeat unit of structure (II) and (III) ranges from about 20 mole % to about 45 mole %, and each mole % for these repeat units are individually selected such that the sum of all the repeat units mole % values for the repeat units present in said blend of random copolymers equals 100 mole %. These ranges encompass compositions which may be used, to produce after coating on a substrate and crosslinking a neutral layer which will direct an annealed overlying block copolymer film to produce a self-assembled pattern which, after etching, produce a post array in an underlying substrate.

Another aspect of this invention are compositions which comprise a blend of at least two random copolymers of the invention, and a spin casting solvent, wherein, based on the total moles of repeat units present in the said blend, the repeat unit of structure (I) ranges from 50 mole % to about 70 mole %.

Another aspect of this invention are compositions which comprise a blend of at least two random copolymers of the invention, and a spin casting solvent, wherein, based on the total moles of repeat units present in the said blend, the repeat unit of structure (II) ranges 7 mole % to about 15 mole %.

Another aspect of this invention are compositions which comprise a blend of at least two random copolymers of the invention, and a spin casting solvent, wherein, based on the total moles of repeat units present in the said blend, the repeat unit of structure (III) ranges from about 18 mole % to about 22 mole %.

Another aspect of this invention are compositions which comprise a blend of at least two random copolymers of the invention, and a spin casting solvent, wherein, based on the total moles of repeat units present in the said blend, the repeat unit of structure (IV) ranges from 1 mole % to about 2.5 mole %.

Another aspect of this invention are compositions which comprise a blend of at least two random copolymers of the invention, and a spin casting solvent, wherein, based on the total moles of repeat units present in the said blend, the mole % sum of repeat unit of structure (II) and (III) from about 25 mole % to about 35 mole %, and each mole % for these repeat units are individually selected such that the sum of all the repeat units mole % values for the repeat units present in said blend of random copolymers equals 100 mole %.

Another aspect of this invention are compositions which comprise a blend of at least two random copolymers of the invention, and a spin casting solvent, wherein said blend is one wherein said random copolymers are blended to achieve the following ranges for each type of repeat unit:

- the repeat unit of structure (I) ranges from about 50 mole % to about 70 mole %,
- the repeat unit of structure (II) ranges from about 7 mole % to about 15 mole %,
- the repeat unit of structure (III) ranges from about 18 mole % to about 22 mole %,
- the repeat unit of structure (IV) ranges from about 1 mole % to about 2.5 mole %,
- the mole % sum of repeat unit of structure (II) and (III) ranges from about 25 mole % to about 35 mole %, and each mole % for these repeat units are individually selected such that the sum of all the repeat units mole % values for the repeat units present in said blend of random copolymers equals 100 mole %. These ranges encompass compositions which may be used, to produce after coating on a substrate and crosslinking a neutral layer which will direct an annealed overlying block copolymer film to produce a self-assembled pattern which, after etching, produce a post array in an underlying substrate.

The solid components of the neutral layer composition described are mixed with a spin casting solvent which may be a single solvent or a mixture of different solvents. Examples of suitable solvent are the following spin casting solvents which may be used as a single solvent component or be combined to form a solvent which is a mixture of at least two solvents that dissolve the solid components of the composition.

The amount of the novel random copolymer to be dissolved in the spin casting solvent to form the inventive neutral layer compositions ranges from about 0.2 wt % to about 2.0 wt % of the weight of the total solution. In another aspect of this invention this amount may range from about 0.3 wt % to about 0.5 wt % of the weight of the total solution.

Suitable spin casting solvents may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

Additionally, the composition may further comprise additives such as surfactants.

The novel neutral layer composition is coated on a substrate and heated to remove the spin casting solvent and crosslink the film. Typical film thickness ranges from about 3 nm to about 50 nm after heating, or about 3 nm to about 30 nm, or about 4 nm to about 20 nm, or about 5 nm to about 20 nm, or about 10 nm to about 20 nm. The film can be heated at temperatures ranging from about 180° C. to about 350° C., or from about 200° C. to about 300° C. Once the crosslinked film has been formed the coating may be used for further processing to finally form a pattern using self-assembly.

The block copolymer for use in self-assembly in conjunction with the inventive neutral layer composition can be any block copolymers which can form domains through self-assembly. The microdomains are formed by blocks of the same type which tend to self-associate. Typically, block copolymer employed for this purpose are polymers in which the repeat units derived from monomers are arranged in blocks which are different compositionally, structurally or both and are capable of phase separating and forming domains. The blocks have differing properties which can be used to remove one block while keeping the other block intact on the surface, thus providing a pattern on the surface. Thus, the block may be selectively removed by plasma etching, solvent etching, developer etching using aqueous alkaline solution, etc. In block copolymers based on organic monomers, one block can be made from polyolefinic monomers including polydienes, polyethers including poly(alkylene oxides) such as poly(ethylene oxide), poly(propylene oxide), poly(butylene oxide) or mixtures thereof; and, the other block can be made from different monomers including poly((meth)acrylates), polystyrenes, polyesters, polyorganosiloxanes, polyorganogermanes, and or mixtures thereof. These blocks in a polymer chain can each comprise one or more repeat units derived from monomers. Depending on the type of pattern needed and methods used different types of block copolymers may be used. For instance, these may consist of diblock copolymers, triblock copolymers, terpolymers, or multiblock copolymers.

The blocks of these block copolymers may themselves consist of homopolymers or copolymers. Block copolymers of different types may also be employed for self-assembly, such as dendritic block copolymers, hyperbranched block copolymers, graft block copolymers, organic diblock copolymers, organoic multiblock copolymers, linear block copolymers, star block copolymers amphiphilic inorganic block copolymers, amphiphilic organic block copolymers or a mixture consisting of at least block copolymers of different types.

The blocks of organic block copolymer may comprise repeat units derived from monomers such as $C_{2-30}$ olefins, (meth)acrylate monomers derived from $C_{1-30}$ alcohols, inorganic-containing monomers including those based on Si, Ge, Ti, Fe, Al. Monomers based on $C_{2-30}$ olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth)acrylate monomers such as (meth)acrylate, methyl (meth)acrylate, ethyl (meth)acrylate, n-propyl (meth)acrylate, isopropyl (meth)acrylate, n-butyl (meth) acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth) acrylate, hydroxyethyl (meth)acrylate or mixtures thereof.

An illustrative example of a block copolymer containing one type of high etch resistant repeat unit would be a polystyrene block containing only repeat units derived from styrene and another type of highly etchable polymethylmethacrylate block containing only repeat units derived from methyl methacrylate. These together would form the block copolymer poly(styrene-b-methylmethacrylate), where b refers to block.

Specific non-limiting examples of block copolymers that are useful for graphoepitaxy, chemoepitaxy or pinned chemoepitaxy as used for directed self-assembly on a patterned neutral layer, are poly(styrene-b-vinyl pyridine), poly (styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the self-assembled polymer to pattern transfer onto the substrate.

Typically, the suitable block copolymers have a weight-averaged molecular weight ($M_w$) in the range of about 30,000 g/mole to about 500,000 g/mole and a polydispersity (PDI) ($M_w/M_n$) of about 1.01 to about 6, or 1.01 to about 2 or 1.01 to about 1.5. Molecular weight, and PDI can be determined by, for example, gel permeation chromatography using a universal calibration method, calibrated to polystyrene standards. This ensures that the polymer blocks have enough mobility to undergo self-assembly when applied to a given surface either spontaneously, or by using a purely thermal treatment, or through a thermal process which is assisted by the absorption of solvent vapor into the polymer framework to increase flow of segments enabling self-assembly to occur.

Solvents suitable for dissolving block copolymers for forming a film can vary with the solubility requirements of the block copolymer. Examples of solvents for the block copolymer assembly include propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. In an embodiment, specifically useful casting solvents include propylene glycol monomethyl ether acetate (PGMEA), gamma-butyrolactone (GBL), or a combination of these solvents.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The block copolymer composition (containing highly etchable and etch resistant blocks) is applied onto a cross-linked coating of the inventive random copolymer overlying a substrate to form an overlying block copolymer film. This block copolymer film may be formed from solutions as described above. Upon application and solvent removal, the block copolymer, film upon annealing may then undergoes self-assembly. The type of self-assembled pattern formed is predicated, as described herein, by careful tuning of the composition of the inventive random copolymer and the composition of the overlying block copolymer.

More specifically, the application of these block copolymer compositions may be done using know coating techniques, such as spinning techniques (including spin drying).

Unexpectedly it has been found that these types of block copolymer may be made, under specific types of self-assembly, to form self-assembled patterns wherein the placement of the etch resistant blocks and the etchable blocks is such that when this pattern is transferred into the substrate by etching either a contact hole array is formed or a post array is formed into the substrate. Specifically, it has been found that in certain block copolymers when applied to the inventive neutral layer the different block segments of the block copolymer will nanophase separate themselves into cylindrical arrays wherein the cylinders are perpendicular to the surface of the novel neutral layer overlying the substrate. Depending of the tuning of the block copolymer and the novel neutral layer these perpendicular cylinders will either contain the etch resistant block segments or the highly etchable block segments. If the nanophase self-assembly is such that these perpendicular cylinders contain the highly etchable block segments, upon etching this nanophase self-assembled film a contact hole array will form into the substrate. Conversely, if the nanophase self-assembly is such that these perpendicular cylinders contain the etch resistant block segments, upon etching this nanophase self-assembled film a post (a.k.a. pillar) array will form into the substrate. The domains, so oriented, are desirably thermally stable under further processing conditions. Thus, after coating a layer this block copolymer containing highly etchable and etch resistant block segments for example, poly(styrene-b-methyl methacrylate), will form on and remain perpendicular to the neutral surface, giving highly resistant and highly etchable regions on the surface of the substrate, which may be further pattern transferred in the substrate layers.

The above described nanophase self-assembled perpendicular cylinder formed by the inventive neutral layer may transferred into the underlying substrate using known techniques. In one example wet or plasma etching could be used with optional UV exposure. Wet etching could be performed with acetic acid. Standard plasma etch processes, such as one with a plasma comprising oxygen, may be used; additionally, argon, carbon monoxide, carbon dioxide, $CF_4$, $CHF_3$, may be present in the plasma.

Specifically, one aspect of this invention is an inventive process for forming an array pattern comprising:

a) coating a composition comprising any of the above described inventive random copolymers, or a blend of these on a substrate, forming a coating of a neutral layer coating;

b) heating said neutral layer coating to form a crosslinked neutral layer;

c) applying a film of a block copolymer material, comprising an etch resistant block and highly etchable block, over said crosslinked neutral layer and annealing said film until a self-assembled film of block copolymer forms; and, d) etching said self-assembled block copolymer film, thereby removing the highly etchable block of the copolymer and forming an array pattern.

In another aspect of this inventive process for forming an array pattern, in step c) said block copolymer material is either a single block copolymer or a blend of at least two different block copolymers, wherein said blend block copolymers is one of different block copolymers, containing the same repeat units comprising the highly etchable block and the same type repeat units comprising the etch resistant block, but differ either in the proportions of these block, weight average molecular weight, number average molecular weight, polydispersity or a mixture of these properties. In yet another aspect of this process in step c) said block copolymer material is either a single poly(styrene-b-methyl methacrylate) block copolymer or a blend of at least two different poly(styrene-b-methyl methacrylate) block copolymers.

Another, aspect of this invention is an inventive process for forming a contact hole array comprising:

a') coating a composition comprising any of the above described inventive random copolymers, which are described herein as suitable for forming contact hole arrays, or a blend of these on a substrate, forming a neutral layer coating;

b') heating said neutral layer coating to form a crosslinked neutral layer;

c') applying a film of a block copolymer material, comprising an etch resistant block and highly etchable block, over said crosslinked neutral layer, and annealing said film until a self-assembled film of block copolymer forms; wherein said block copolymer material is either a single polystyrene-b-poly(methyl methacrylate) block copolymer or a blend of at least two different polystyrene-b-poly(methyl methacrylate) block copolymers, wherein in said block copolymer material the mole % of the repeat units, as measure against the total moles of styrene derived repeat units and methyl methacrylate repeat units, for said polystyrene derived repeat unit ranges from about 60 mole % to about 75 mole %, and for said methyl methacrylate derived repeat units range from about 25 mole % to about 40 mole %, d') etching said self-assembled block copolymer film, thereby removing the highly etchable block of the copolymer and forming a contact hole array.

Another, aspect of this invention is an inventive process for forming a post array comprising:

a") coating a composition comprising any of the above described inventive random copolymers, which are described herein as suitable for forming post arrays, or a blend of these on a substrate, forming a neutral layer coating;

b") heating the neutral layer coating to form a crosslinked neutral layer;

c") applying a film of a block copolymer material, comprising an etch resistant block and highly etchable block, over said crosslinked neutral layer, and annealing said film until a self-assembled film of block copolymer forms; and wherein said block copolymer material is either a single polystyrene-b-poly(methyl methacrylate) block copolymer or a blend of at least two different polystyrene-b-poly(methyl methacrylate) block copolymers wherein in said block copolymer material the mole % of the repeat units, as measure against the total moles of styrene derived repeat units and methyl methacrylate repeat units, for said polystyrene derived repeat unit ranges from about 25 mole % to about 40 mole %, and for said methyl methacrylate derived repeat units range from about 60 mole % to about 75 mole %, d") etching said self-assembled block copolymer film, thereby removing the highly etchable block of the copolymer and forming a post array.

The substrate over which the neutral layer is coated is any required by the device. In one example the substrate is a wafer coated with a layer of high carbon content organic layer with a coating of silicon or titanium containing ARC (high etch resistance to oxygen plasma) over it, which allows pattern transfer of the patterned block copolymer into these coatings. Suitable substrates include, without limitation, silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group III/V compounds. These substrates may be coated with antireflective coating(s). The substrate may comprise any number of layers made from the materials described above.

Another aspect of this invention is the use of the random copolymer of the invention or of the composition of the invention for preparing a crosslinked neutral layer on a substrate, in order to affect annealing self-assembly of a block copolymer film forming a repeating pattern, which when etched may form either an array of contact holes or an array of posts in said substrate.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Chemicals

4-Vinylbenzocyclobutene (VBCB) (CAS: 99717-87-0) was obtained from Sun & Bright Industrials, Room B, 20th Floor, 333 Tai Ping Nan Lu Nanjing, China. All other chemicals unless otherwise indicated were purchased from Sigma Aldrich (3050 Spruce St., St. Louis, MO 63103) as listed in Table 1.

All synthetic experiments were carried out under $N_2$ atmosphere. Lithographic experiments were carried out as described in the text. The molecular weight of the copolymers was measured with a Gel Permeation Chromatograph.

Lithographic Experiments were done using a TEL Clean ACT8 track. SEM pictures were taken with a applied Materials NanoSEM_3D Scanning electron microscope picture are shown at 1Fov magnification or 2Fov magnification.

Comparative Example 1

Synthesis of Random Crosslinkable Copolymers: Copolymer of Styrene, Methyl Methacrylate and 4-Vinylbenzycylobutene Synthesized with AIBN A 2000-ml flask equipped with a condenser, temperature controller, heating mantle and mechanical stirrer were set up. 87.0 grams (0.84 moles) of styrene (S), 139.8 grams (1.40 moles) of methyl methacrylate (MMA), 72.4 grams (0.56 moles) of 4-Vinylbenzocyclobutene (VBCB) and 1.83 grams (0.011 moles) of Azobisisobutyronitrile (AIBN) initiator and 600 grams of anisole were added to the flask. The mechanical stirrer was turned on and set up at about 120 rpm. The reaction solution was then degassed by vigorously bubbling nitrogen through the solution for about 30 minutes at room temperature. After 30 minutes of degassing the heating mantle was turned on and the temperature controller was set at 70° C., and the stirred reaction mixture was maintained at this temperature for 20 hours. After this time the heating mantle was turned off and the reaction solution was allowed to cool down to about 40° C. Then the reaction mixture was poured into 12 L of isopropanol stirred with a mechanical stirring during the addition. During this addition, the polymer was precipitated out. The precipitated polymer was collected by filtration. The collected polymer was dried in vacuum oven at 40° C. About 170 grams of the polymer was obtained. This dried polymer was dissolved in 600 grams of THF and then filtered through a 0.2 μm nylon filter. The filtered solution was then precipitated again into a stirred solution of 12 L methanol, the precipitated polymer collected and dried as before under vacuum at 40° C. In this manner, 150 grams (50% yields) of the polymer was obtained after dry. The polymer had an $M_w$ of about 38,000 g/mole and a polydispersity (PDI) of 1.5 (Table 2).

Comparative Example 2

Copolymer of Styrene, Methyl Methacrylate, and Glycidyl Methacrylate Synthesized with AIBN A 250-ml flask equipped with a temperature controller, heating mantle and magnetic stirrer were set up. 26.04 grams (0.25 moles) of styrene, 24.03 grams (0.24 moles) of methyl methacrylate, 1.42 grams (0.10 moles) of glycidyl methacrylate, 0.41 grams (0.0025 moles) of Azobisisobutyronitrile (AIBN) initiator and 100 grams of anisole were added to the flask. The stirrer was turned on and set up at about 400 rpm. The reaction solution was then degassed by vigorously bubbling nitrogen through the solution for about 30 minutes at room temperature. After 30 minutes of degassing the heating mantle was turned on and the temperature controller was set at 70° C., and the stirred reaction mixture was maintained at this temperature for 20 hours. After this time the heating mantle was turned off and the reaction solution was allowed to cool down to about 40° C. Then the reaction mixture was poured into 1.554 L of isopropanol stirred with a mechanical stirring during the addition. During this addition, the polymer was precipitated out. The precipitated polymer was collected by filtration. The collected polymer was dried in vacuum oven at 40° C. About 36 grams of the polymer was obtained. This dried polymer was dissolved in 300 grams of THF and then filtered through a 0.2 μm nylon filter. The filtered solution was then precipitated again into a stirred solution of 1.5 L methanol, the precipitated polymer collected and dried as before under vacuum at 40° C. In this manner, 26 grams (50% yields) of the polymer was obtained after dry. The polymer had an $M_w$ of about 36,000 g/mole and a polydispersity (PDI) of 1.5

Example 1

Synthesis of Inventive Random Fast Crosslinkable Copolymers:

Copolymer of Styrene, Methyl Methacrylate, 4-Vinylbenzycylobutene and Glycidyl Methacrylate Synthesized with AIBN A 2000-ml flask equipped with a condenser, temperature controller, heating mantle and mechanical stirrer were set up. 87.0 grams (0.84 moles) of styrene, 134.1 grams (1.34 moles) of methyl methacrylate, 72.4 grams (0.56 moles) of 4-Vinylbenzocyclobutene, 7.92 grams (0.06 moles) of glycidyl methacrylate, 1.83 grams (0.011 moles) of Azobisisobutyronitrile (AIBN) initiator and 600 grams of anisole were added to the flask. The mechanical stirrer was turned on and set up at about 120 rpm. The reaction solution was then degassed by vigorously bubbling nitrogen through the solution for about 30 minutes at room temperature. After 30 minutes of degassing the heating mantle was turned on and the temperature controller was set at 70° C., and the stirred reaction mixture was maintained at this temperature for 20 hours. After this time the heating mantle was turned off and the reaction solution was allowed to cool down to about 40° C. Then the reaction mixture was poured into 12 L of isopropanol stirred with a mechanical stirring during the addition. During this addition, the polymer was precipitated out. The precipitated polymer was collected by filtration. The collected polymer was dried in vacuum oven at 40° C. About 170 grams of the polymer was obtained. This dried polymer was dissolved in 600 grams of THF and then filtered through a 0.2 μm nylon filter. The filtered solution was then precipitated again into a stirred solution of 12 L methanol, the precipitated polymer collected and dried as before under vacuum at 40° C. In this manner, 150 grams (50% yields) of the polymer was obtained after dry. The polymer had an $M_w$ of about 38,000 g/mole and a polydispersity (PDI) of 1.5.

Examples 2 to 5

The inventive random copolymers of examples 2 to 5 (Table 1) were synthesized using similar procedure as described in example 2. Only the mole % of styrene and MMA were changed to produce desired fast crosslinkable polymers which are either suitable as a single polymer for contact hole array formation (Example 1), post array formation (Example 5), or polymer material which can be blended together to achieve ratios of the repeat units appropriate for either contact hole arrays or post arrays (Examples 2, 3, 4) for the orientation of PS-b-PMMA for contact hole and PS post assemblies (see Processing Examples 1 to 6).

Example 6

Synthesis of Block Copolymer of Styrene and Methyl Methacrylate (PS-b-PMMA) (PS/PMMA: 65/35)

Two different PS-b-PMMA (PS/PMMA: 65/35) polymers were synthesized via sequential living anionic polymerization of styrene (S) and methyl methacrylate (MMA) in tetrahydrofuran (THF) as a solvent using sec-butyllithium (1.4 M, Aldrich) as an initiator. The reaction was performed at −78° C. in the presence of LiCl (high purity, Aldrich) under purified argon environment. The feed ratio of monomers was used to obtain a 65/35 mole ratio polymers and the low and high molecular weight 65/35 PS-b-PMMA polymers were made by respectively using 0.142 mole % and 0.062 mole % of initiator versus total moles of monomer. The molecular weight in a PS-b-PMMA were characterized by size-exclusion chromatography (SEC). The number-averaged molecular weight ($M_n$) for low molecular weight and high molecular weight BCP were 49,000 g/mole and 107,000 g/mole, respectively with both having a PDI of 1.02. The PS mole % determined by 1H NMR for the low and high molecular weight BCP were respectively 65.5 and 65.9% respectively. These two samples were used for contact hole self-assembly either as a single BCP or by blending of these two.

Example 7

Synthesis of Block Copolymer of Styrene and Methyl Methacrylate (PS-b-PMMA) (PS/PMMA: 30/70)

Two different PS-b-PMMA (PS/PMMA: 30/70) polymers one having a low molecular weight and one having a high molecular weight were prepared in the same manner as Example 6 except that the ratio of MMA and S was adjusted to yield a block copolymer with 30 mole % and that the low and high molecular weight 30/70 mole ratio PS-b-PMMA polymers were made by respectively using 0.28 mole % and 0.12 mole % of initiator versus total moles of monomer. The low molecular and high molecular weight polymer had $M_n$ of 45,000 g/mole, and 137,000 g/mole, respectively, with PDI of 1.04 and 1.05, respectively. These materials were used for post self-assembly either as a single BCP or by blending of these two polymers.

Then the wafer was rinsed with EBR (70:30) for 45 seconds, spin dried for 30 seconds, soft baked at 110° C. for 1 min (~8 nm Film thickness (FT)).

A 0.02 μm PTFE filtered solution containing 1.5 wt % of a diblock copolymer of styrene and methyl methacrylate (PS-b-PMMA) ($M_n$=107,000 g/mole, PDI=1.02) (from Example 6) was applied at 1500 rpm and the wafer was subsequently soft baked at 110° C. for 1 min then annealed at 250° C. under $N_2$ for 3 minutes (40 nm). FIG. 1 shows that this material formed a parallel self-assembly which is not useful for etching pattern transfer into the substrate of either contact hole arrays or post arrays

Comparative Processing Example 2

Undesirable Self-Assembly of BCP on Crosslinkable Reference Underlayer

A solution was made in PGMEA with 0.32 wt % of the polymer of Comparative Example 2 [copolymer of (I), (II), and (IV)] which was filtered through a 0.02 μm PTFE filter. Substrate preparation: A silicon wafer was coated with this polymer solution at 1500 rpm and the wafers were subsequently each baked at 240° C. for 1 min. Then the wafer was rinsed with EBR (70:30) for 45 seconds, spin dried for 30 seconds, soft baked at 110° C. for 1 min (~7 nm FT). The crosslinkable mat had 8 nm thickness. However, after rinse the film thickness was reduced to 7 nm which indicated film loss and that the film was not suitable for our desired application.

TABLE 1

Synthesis of crosslinkable and fast-crosslinkable random copolymers and molecular characterization data

| M/property (mol.) | Comparative Example 1 | Example 1 | Example 2 | Example 3 | Example 4 | Example 5 |
|---|---|---|---|---|---|---|
| MMA (I) mole % | 50 | 48 | 28 | 38 | 58 | 68 |
| S mole % (II) | 30 | 30 | 50 | 40 | 20 | 10 |
| VBCB (III) mole % | 20 | 20 | 20 | 20 | 20 | 20 |
| GMA (IV) mole % | 0 | 2 | 2 | 2 | 2 | 2 |
| Sum of S and VBCB Mole % | 50 | 50 | 70 | 60 | 40P | 30 |
| Mw | 38,000 | 43,000 | 35,000 | 42,000 | 49,000 | 39,000 |
| PDI | 1.5 | 1.5 | 1.5 | 1.5 | 1.5 | 1.5 |
| Self Assembly Application | Comparative Example: Does not work for either contact hole or post | Contact Hole | Polymer useful for blending for either contact hole or post | Polymer useful for blending for either contact hole or post | Polymer useful for blending for either contact hole or post | post |

Comparative Processing Example 1

Undesirable Self-Assembly of BCP on Crosslinkable Reference Underlayer

A solution was made in PGMEA with 0.7 wt % of the polymer of Comparative Example 1 which was filtered through a 0.02 μm PTFE filter. Substrate preparation: A silicon wafer was coated with the polymer of Comparative Example 1 (0.7 wt % in PGMEA) at 1500 rpm and the wafers were subsequently each baked at 240° C. for 5 min.

Processing Example 1

Contact Hole Array Self-Assembly of Block Copolymer (BCP) on Fast Crosslinkable Underlayer Based on Example 1

The polymer of Example 1 was dissolved in PGMEA to form 0.32 wt % solution. This solution was filtered using a 0.02 μm PTFE filter and then coated at 1500 rpm on $SiO_x$ wafers, and the wafers were subsequently each baked at 240° C. for 1 min in air to produce $SiO_x$ wafers coated with the crosslinked neutral layer (FT 8 nm). This film was used directly in the subsequent coating with the block copolymer film. However, Table 2 shows that this crosslinked film of the polymer of Example 1, when treated with the spin casting solvent PGMEA only undergoes a small insignificant thickness loss, which was in contrast to what was found in Comparative processing example 2 which showed a large film thickness loss making it unusable for overcoating with the block copolymer.

The wafers coated with the crosslinked neutral layer were then coated with a 0.02 μm PTFE filtered 1.5 wt % solution in PGMEA of a diblock copolymer of styrene and methyl methacrylate (PS-b-PMMA) ($M_n$=49,000 g/mole, PDI=1.02) (from Example 6) by spin coating at 1,500 rpm and subsequently soft baked at 110° C. for 1 min then annealed at 250° C. under $N_2$ for 3 minutes. FIG. 2 shows that this material formed a self-assembled pattern in which an array of nanophase segregated cylinders perpendicular to the substrate was formed which contain the etchable block derived from methyl methacrylate. This microphase segregated array is one suitable to use for etching pattern transfer into the substrate of a contact hole array.

Processing Example 2

Post Array Self-Assembly of Block Copolymer (BCP) on Fast Crosslinkable Underlayer Based on Example 5

The polymer of Example 5 was dissolved in PGMEA to form 0.32 wt % solution. This solution was filtered using a 0.02 μm PTFE filter and then coated at 1500 rpm on $SiO_x$ wafers, and the wafers were subsequently each baked at 240° C. for 1 min to produce $SiO_x$ wafers coated with the crosslinked neutral layer (FT 8 nm). Table 2 shows that this crosslinked film of the polymer of Example 5, when treated with the spin casting solvent PGMEA only undergoes a small insignificant thickness loss, which was in contrast to what was found in Comparative processing example 2 which showed a very large film thickness loss making it unusable for overcoating with the block copolymer.

The wafers coated with the crosslinked neutral layer were then coated with a PTFE filtered 1.5 wt % solution in PGMEA of a diblock copolymer of styrene and methyl methacrylate (PS-b-PMMA) ($M_n$=45,000 g/mole, PDI=1.04) by spin coating at 1,500 rpm and subsequently soft baked at 110° C. for 1 min then annealed at 250° C. under $N_2$ for 3 minutes. FIG. 3 shows that this material formed a self-assembled pattern in which an array of nanophase segregated cylinders perpendicular to the substrate was formed which contain the etch resistant block segments derived from styrene. This microphase segregated array is one suitable to use for etching pattern transfer into the substrate of a post array.

Processing Example 3

Contact Hole Array Self-Assembly of Block Copolymer (BCP) on Fast Crosslinkable Underlayer Based on Blend of Examples 2 and Example 4

The polymers of Example 2 and Example 4 were dissolved in a 60:40 wt ratio of in PGMEA to form 0.32 wt % solution. This solution was filtered using a 0.02 μm PTFE filter and then coated at 1500 rpm on $SiO_x$ wafers, and the wafers were subsequently each baked at 240° C. for 1 min in air to produce $SiO_x$ wafers coated with the crosslinked neutral layer (FT 8 nm). Table 2 shows that this crosslinked film of this blend of the polymers of 2 and 4, when treated with the spin casting solvent PGMEA only undergo a small insignificant thickness loss, which was in contrast to what was found in Comparative processing example 2 which showed a very large film thickness loss making it unusable for overcoating with the block copolymer. The wafers coated with the crosslinked neutral layer were then coated with a 0.02 μm PTFE filtered 1.5 wt % solution in PGMEA of a diblock copolymer of styrene and methyl methacrylate (PS-b-PMMA) ($M_n$=49,000 g/mole, PDI=1.02) (from Example 6) by spin coating at 1,500 rpm and subsequently soft baked at 110° C. for 1 min then annealed at 250° C. under $N_2$ for 3 minutes. FIG. 4 shows that this material formed a self-assembled pattern in which an array of nanophase segregated cylinders perpendicular to the substrate was formed which contain the etchable block derived from methyl methacrylate. This microphase segregated array is one suitable to use for etching pattern transfer into the substrate of a contact hole array.

Processing Example 4

Post Array Self-Assembly of Block Copolymer (BCP) on Fast Crosslinkable Underlayer Based on Based on Blend of Example 3 and Example 5

The polymers of Example 3 and Example 5 were dissolved in a 30:70 wt ratio in PGMEA to form 0.32 wt % solution. This solution was filtered using a 0.02 μm PTFE filter and then coated at 1500 rpm on $SiO_x$ wafers, and the wafers were subsequently each baked at 240° C. for 1 min to produce $SiO_x$ wafers coated with the crosslinked neutral layer (FT 8 nm). Similar to what was found for the blend of Example 2 and 4 a crosslinked film from this blend when treated with the spin casting solvent PGMEA only undergo a small insignificant thickness loss. The wafers coated with the crosslinked neutral layer were then coated with a PTFE filtered 1.5 wt % solution in PGMEA of a diblock copolymer of styrene and methyl methacrylate (PS-b-PMMA) ($M_n$=45,000 g/mole, PDI=1.04) by spin coating at 1,500 rpm and subsequently soft baked at 110° C. for 1 min then annealed at 250° C. under $N_2$ for 3 minutes, FIG. 5 shows that this material formed a self-assembled pattern in which an array of nanophase segregated cylinders perpendicular to the substrate was formed which contain the etch resistant block segments derived from styrene. This microphase segregated array is one suitable to use for etching pattern transfer into the substrate of a post array.

Processing Example 5

Contact Hole Array Self-Assembly of Block Copolymer (BCP) on Fast Crosslinkable Underlayer Based on Based on Blend of Two BCP's with Low Mn and High Mn The polymer of Example 1 was dissolved in PGMEA to form 0.32 wt % solution. This solution was filtered using a 0.02 μm PTFE filter and then coated at 1500 rpm on $SiO_x$ wafers, and the wafers were subsequently each baked at 240° C. for 1 min to produce $SiO_x$ wafers coated with the crosslinked neutral layer (FT 8 nm).

The wafers coated with the crosslinked neutral layer were then coated with a PTFE filtered 1.5 wt % solution in PGMEA from a blend of two diblock copolymer of styrene and methyl methacrylate (PS-b-PMMA) with ($M_n$=49,000 g/mole, PDI=1.02) and ($M_n$=107,000 g/mole, PDI=1.02) in 40:60 wt ratio by spin coating at 1,500 rpm and subsequently soft baked at 110° C. for 1 min then annealed at 250° C. under $N_2$ for 3 minutes. FIG. 6 shows that this material formed a self-assembled pattern in which an array of nanophase segregated cylinders perpendicular to the substrate was formed which contain the etchable block segments derived from methyl methacrylate. This microphase segregated array is one suitable to use for etching pattern transfer into the substrate of a contact hole array.

Processing Example 6

Post Array Self-Assembly of Block Copolymer (BCP) on Fast Crosslinkable Underlayer Based on Based on Blend of Two BCP's with Low Mn and High Mn The polymer of Example 5 was dissolved in PGMEA to form 0.32 wt % solution. This solution was filtered using a 0.02 μm PTFE filter and then coated at 1500 rpm on $SiO_x$ wafers, and the wafers were subsequently each baked at 240° C. for 1 min to produce $SiO_x$ wafers coated with the crosslinked neutral layer (FT 8 nm).

The wafers coated with the crosslinked neutral layer were then coated with a PTFE filtered 1.5 wt % solution in PGMEA from a blend of two diblock copolymer of styrene and methyl methacrylate (PS-b-PMMA) with ($M_n$=45,000 g/mole, PDI=1.04) and ($M_n$=137,000 g/mole, PDI=1.05) in 40:60 wt ratio by spin coating at 1,500 rpm and subsequently soft baked at 110° C. for 1 min then annealed at 250° C. under $N_2$ for 3 minutes. FIG. 7 shows that this material formed a self-assembled pattern in which an array of nanophase segregated cylinders perpendicular to the substrate was formed which contain the etch resistant block segments derived from styrene. This microphase segregated array is one suitable to use for etching pattern transfer into the substrate of a post array.

TABLE 2

Film Thickness Results, Process conditions; 0.32% wt., 1500 rpm, 240° C./1 min (air) (ref. to Comparative Processing Example 2)

| Sample ID (20% VBCB) | Parameter | MAT (240° C./1 min) | After Soak (PGMEA 2 min) | After 110° C./1 min Soft-bake | Delta |
|---|---|---|---|---|---|
| Ex-5 (Table 1) | Film Thickness (nm) | 8.09 | 8.25 | 8.01 | −0.08 |
| (60% $PS_{total}$) Blend of Ex. 2 &4 (Table 1) | Film Thickness (nm) | 8.15 | 8.37 | 8.08 | −0.07 |
| (50% $PS_{total}$) Ex. 1 (Table 1) | Film Thickness (nm) | 8.05 | 8.24 | 7.93 | −0.12 |

The invention claimed is:

1. A random copolymer comprising the following repeat units of structure (I), (II), (III), and (IV)

(I)

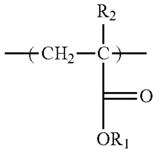

(II)

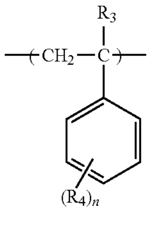

-continued (III)

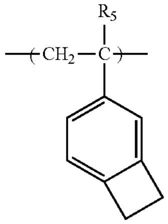

(IV)

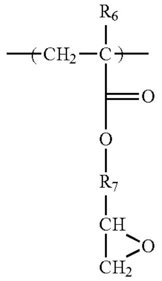

wherein, $R_1$ is selected from the group consisting of a C-1 to C-4 alkyl, $R_2$, $R_3$, $R_5$, and $R_6$ are independently selected from the group consisting of H, and a C-1 to C-4 alkyl, $R_4$ is a C-1 to C-4 alkyl, and n is an integer from 0 to 5, and $R_7$ is an alkylene is selected from a C-1 to C-4 alkylene, wherein further based on the total moles of all repeat units, the repeat unit of structure (I) is present in a range from 8 mol % to 58 mol %, the repeat unit of structure (II) is present in a range from 20 mole % to 80 mole %, the repeat unit of structure (III) is present in a range from 10 mole % to 20 mole %, the repeat unit of structure (IV) is present in a range from 1 mole % to 5 mole %, and each mole % for these repeat units are individually selected such that the sum of all the repeat units mole % values for the repeat units present in said random copolymer equals 100 mole %.

2. The random copolymer according to claim 1 consisting essentially of repeat units of structures (I), (II), (III), and (IV).

3. The random copolymer according to claim 1, wherein each polymer chain of said random copolymer further comprises a first end group, which is a benzylic alcohol comprising moiety of structure (V), wherein n' is an integer and ranges from 1 to 5; n" is an integer and ranges from 1 to 5;

n'" is an integer and ranges from 1 to 5;

$R_8$ is a C-1 to C-8 alkyl; X is —CN or an alkyloxycarbonyl moiety $R_9$—O—(C—O)— where $R_9$ is a C-1 to C-8 alkyl; and ∿∿ represent the attachment point of said end group to said random copolymer, (V)

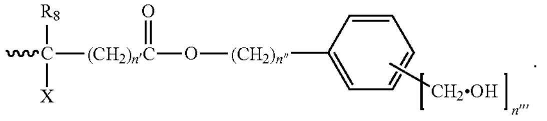

4. The random copolymer polymer according to claim 1 wherein, n is 0, $R_2$ and $R_6$ are independently selected from the group consisting of $CH_3$, and H, $R_3$ and $R_5$ are H, and $R_7$ is a C-1 to C-3 alkylene.

5. The random copolymer according to claim 1, wherein $R_1$, $R_2$, and $R_6$ are methyl, $R_3$ and $R_5$ are H, $R_7$ is methylene and n=0.

6. The random copolymer according to claim 3, wherein said first end group has structure (Va):

(Va)

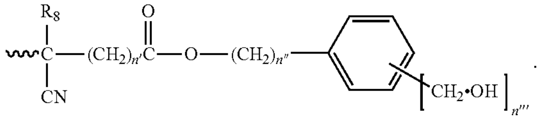

7. The random copolymer according to claim 3, wherein said random copolymer further comprises in each polymer chain further a second end group selected from H and a C-1 to C-4 alkyl moiety.

8. The random copolymer according to claim 1, wherein, based on the total moles of all repeat units, the repeat unit of structure (I) is present in a range from 28 mole % to 58 mole %, the repeat unit of structure (II) is present in a range from 20 mole % to 40 mole %, the repeat unit of structure (III) is present in a range from 15 mole % to 20 mole %, the repeat unit of structure (IV) is present in a range from 1 mole % to 3 mole %, and the mole % sum of repeat unit of structure (II) and (III) ranges from 40 mole % to 60 mole %, and each mole % for these repeat units are individually selected such that the sum of all the repeat units mole % values for the repeat units present in said random copolymer equals 100 mole %.

9. The random copolymer according to claim 1, wherein, based on the total moles of all repeat units, the repeat unit of structure (I) is present in a range from 35 mole % to 55 mole %, the repeat unit of structure (II) is present in a range from 25 mole % to 35 mole %, the repeat unit of structure (III) is present in a range from 18 mole % to 20 mole %, the repeat unit of structure (IV) is present in a range from 1 mole % to 2.5 mole %, the mole % sum of repeat unit of structure (II) and (III) is present in a range from 40 mole % to 57 mole %, and each mole % for these repeat units are individually selected such that the sum of all the repeat units mole % values for the repeat units present in said random copolymer equals 100 mole %.

10. The random copolymer according to claim 1, wherein, based on the total moles of all repeat units, the repeat unit of structure (I) is present in a range from 48 mole % to 58 mole %, the repeat unit of structure (II) is present in a range from 10 mole % to 20 mole %, the repeat unit of structure (III) is present in a range from 15 mole % to 20 mole %, the repeat unit of structure (IV) is present in a range from 1 mole % to 3 mole %, the mole % sum of repeat unit of structure (II) and (III) is present in a range from 20 mole % to 40 mole %, and each mole % for these repeat units are individually selected such that the sum of all the repeat units mole % values for the repeat units present in said random copolymer equals 100 mole %.

11. The random copolymer according to claim 1, wherein, based on the total moles of all repeat units, the repeat unit of structure (I) is present in a range from 50 mole % to 58 mole %, the repeat unit of structure (II) is present in a range from 20 mole % to 30 mole %, the repeat unit of structure (III) is present in a range from 18 mole % to 20 mole %, the repeat unit of structure (IV) is present in a range from 1 mole % to 2.5 mole %, the mole % sum of repeat unit of structure (II) and (III) ranges from 38 mole % to 50 mole %, and each mole % for these repeat units are individually selected such that the sum of all the repeat units mole % values for the repeat units present in said random copolymer equals 100 mole %.

12. A composition comprising said random copolymer according to claim 1, and a spin casting solvent.

13. The composition of claim 12 wherein said composition comprises a mixture of at least two said random copolymers according to claim 1, and a spin casting solvent.

14. A composition comprising said random copolymer according to claim 8, and a spin casting solvent.

15. A composition comprising a blend of at least two random copolymers of claim 1, and a spin casting solvent, wherein, based on the total moles of repeat units present in the said blend, the repeat unit of structure (I) is present in a range from 28 mole % to 58 mole %, the repeat unit of structure (II) is present in a range from 20 mole % to 40 mole %, the repeat unit of structure (III) is present in an amount of 20 mole %, the repeat unit of structure (IV) is present in a range from 1 mole % to 3 mole %, the mole % sum of repeat unit of structure (II) and (III) is present in a range from 40 mole % to 60 mole %, and each mole % for these repeat units are individually selected such that the sum of all the repeat units mole % values for the repeat units present in said blend of random copolymers equals 100 mole %.

16. A composition comprising said random copolymer according to claim 10, and a spin casting solvent.

17. A composition comprising a blend of at least two random copolymers of claim 1, and a spin casting solvent, wherein, based on the total moles of repeat units present in the said blend, the repeat unit of structure (I) is present in a range from 48 mole % to 58 mole %, the repeat unit of structure (II) is present in a range from 20 mole % to 30 mole %, the repeat unit of structure (III) is present in an amount of 15 mole %, the repeat unit of structure (IV) is present in a range from 1 mole % to 3 mole %, the mole % sum of repeat unit of structure (II) and (III) is present in a range from 35 mole % to 45 mole %, and each mole % for these repeat units are individually selected such that the sum of all the repeat units mole % values for the repeat units present in said blend of random copolymers equals 100 mole %.

18. A process for forming an array pattern comprising:

a) coating the composition of claim 12, on a substrate, forming a neutral layer coating;

b) heating the neutral layer coating to form a crosslinked neutral layer;

c) applying a film of a block copolymer material, comprising an etch resistant block and etchable block, over said crosslinked neutral layer and annealing said film until a self-assembled film of block copolymer forms; and, d) etching said self-assembled block copolymer film, thereby removing the etchable block of the copolymer and forming an array pattern.

19. A process for forming a contact hole array comprising:

a') coating the composition of claim 14 on a substrate, forming a neutral layer coating;

b') heating said neutral layer coating to form a crosslinked neutral layer;

c') applying a film of a block copolymer material, comprising an etch resistant block and etchable block, over said crosslinked neutral layer, and annealing said film until a self-assembled film of block copolymer forms; and wherein said block copolymer material is either a single polystyrene-b-poly (methyl methacrylate) block copolymer or a blend of at least two different polystyrene-b-poly(methyl methacrylate) block copolymers wherein in said block copolymer material mole % of repeat units derived from styrene is in a range from about 60 mole % to about 75 mole %, and mol % of repeat units derived from methyl methacrylate is in a range from about 25 mole % to about 40 mole %, both based on total moles of repeat units derived from styrene and methyl methacrylate, d') etching said self-assembled block copolymer film, thereby removing the etchable block of the copolymer and forming a contact hole array.

20. A process for forming a post array comprising:

a") coating the composition of claim 16, on a substrate, forming a neutral layer coating;

b") heating said neutral layer coating to form a crosslinked neutral layer;

c") applying a film of a block copolymer material, comprising an etch resistant block and etchable block, over said crosslinked neutral layer, and annealing said film until a self-assembled film of block copolymer forms; and wherein said block copolymer material is either a single polystyrene-b-poly (methyl methacrylate) block copolymer or a blend of at least two different polystyrene-b-poly(methyl methacrylate) block copolymers wherein in said block copolymer material mole % of repeat units derived from styrene is in a range of about 25 mole % to about 40 mole %, and mole % of repeat units derived from methyl methacrylate is in a range from about 60 mole % to about 75 mole %, both based on total moles of repeat units derived from styrene and methyl methacrylate, d") etching said self-assembled block copolymer film, thereby removing the highly etchable block of the copolymer and forming a post array.

* * * * *